(12) United States Patent
Murto et al.

(10) Patent No.: US 7,045,456 B2
(45) Date of Patent: May 16, 2006

(54) MOS TRANSISTOR GATES WITH THIN LOWER METAL SILICIDE AND METHODS FOR MAKING THE SAME

(75) Inventors: Robert William Murto, Austin, TX (US); Luigi Colombo, Dallas, TX (US); Mark Robert Visokay, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/745,454

(22) Filed: Dec. 22, 2003

(65) Prior Publication Data

US 2005/0136605 A1  Jun. 23, 2005

(51) Int. Cl.
*H01L 21/4763* (2006.01)
*H01L 21/44* (2006.01)

(52) U.S. Cl. .................. 438/649; 438/651; 438/655; 438/656

(58) Field of Classification Search ................ 438/649, 438/651, 655, 656
See application file for complete search history.

(56) References Cited

U.S. PATENT DOCUMENTS

| | | | |
|---|---|---|---|
| 4,628,588 A | 12/1986 | McDavid | 438/585 |
| 4,641,417 A | 2/1987 | McDavid | 438/586 |
| 4,672,419 A | 6/1987 | McDavid | 257/382 |
| 4,954,867 A | 9/1990 | Hosaka | 257/639 |
| 5,633,522 A | 5/1997 | Dorleans et al. | 257/344 |
| 5,723,893 A | 3/1998 | Yu et al. | 257/413 |
| 5,937,315 A | 8/1999 | Xiang et al. | 438/486 |
| 6,103,607 A * | 8/2000 | Kizilayalli et al. | 438/588 |
| 6,376,342 B1 | 4/2002 | Tseng | 438/517 |
| 6,410,967 B1 | 6/2002 | Hause et al. | 257/377 |
| 6,432,817 B1 | 8/2002 | Bertrand et al. | 438/651 |
| 6,482,705 B1 * | 11/2002 | Yu | 438/300 |
| 6,602,781 B1 | 8/2003 | Xiang et al. | 438/655 |
| 6,617,624 B1 | 9/2003 | Powell | 257/288 |
| 2003/0109121 A1 | 6/2003 | Rotondaro | 458/592 |

OTHER PUBLICATIONS

"Mo₂N/Mo GAFP MOSFETs", Manjin J. Kim and Dale M. Brown, IEEE, 1982, pp. 560-563.
"Application of MoSi₂ to the Double-Level Interconnections of I²L Circuits", Yoshitaka Sasaki, Osamu Ozawa, and Shuichi Kamey Ama, IEEE Transactions on Electron Devices, vol. ED-27, No. 8, Aug., 1980, 5 pgs.

(Continued)

*Primary Examiner*—William M. Brewster
(74) *Attorney, Agent, or Firm*—Jacqueline J. Garner; W. James Brady, III; Frederick J. Telecky, Jr.

(57) ABSTRACT

Methods are presented for fabricating transistor gate structures, wherein upper and lower metal suicides are formed above a gate dielectric. In one example, the lower silicide is formed by depositing a thin first silicon-containing material over the gate dielectric, which is implanted and then reacted with a first metal by annealing to form the lower silicide. A capping layer can be formed over the first metal prior to annealing, to prevent oxidation of the metal prior to silicidation, and a barrier layer can be formed over the lower silicide to prevent reaction with subsequently formed silicon material. In another example, the lower silicide is a multilayer silicide structure including a plurality of metal silicide sublayers.

14 Claims, 15 Drawing Sheets

OTHER PUBLICATIONS

"Work Function Controlled Silicide Technology for Submicron CMOS", Masakazu Kakumu and Kazuhiko Hashimoto, Source and date unknown, 2 pgs.

"Refractory Metal Silicide/N+ Polysilicon in CMOS/SOS", B. C. Leung and J. S. Maa, Source and date unknown, 4 pgs.

"Fabrication of Mo-Gate/TI-Silicide-Clad-Moat MOS Devices by Use of Multilayer-Glass Depositions", J. M. McDavid, IEEE Electron Device Letters, vol. EDL-5, No. 9, Sep., 1984, 2 pgs.

"Lightly Impurity Doped (LD) Mo Silicide Gate Technology", Masakazu Kakumu and Jun'ichi Matsunaga, IEEE, 1985, pp. 415-418.

"An Investigation of Molybdenum Gate for Submicrometer CMOS", Robert F. Kwasnick, Edmund B. Kaminsky, Paul A Frank, Gerhard A Franz, Kenneth J. Polasko, Richard J. Saia and Thomas B. Gorczya, IEEE Transactions on Electron Devices, vol. 35, No. 9, Sep., 1988, 7 pgs.

"Electrical Characteristics of $TiB_2$ for ULSI Applications", Chang Sik Choi, Qingfeng Wang, Carlton M. Osburn, Gary A Ruggles and Ayan S. Shah, IEEE Transactions on Electron Devices, vol. 39, No. 10, Oct., 1992, pp. 2341-2345.

"Fin FET Process Refinements for Improved Mobility and Gate Work Function Engineering", Yang-Kyu Choi, Leland Chang, Pushkar Ranade, Jeong-Soo Lee, Daewon Ha, Sriram Balasubramanian, Aditya Agarwal, Mike Ameen, Tsu-Jae King, and Jeffrey Bokor, IEEE, 2002, 4 pgs.

"Silicon Processing for The VLSI Era, vol. 2: Process Integration", *MOS Devices and NMOS Process Integration,* Stanley Wolf PhD. 1990, 7 pgs.

"High Speed CMOS Structure with Optimized Gate Work Function", T. Noguchi, Y. Asahi, M. Nakahara, K. Maeguchi and K. Kanzaki, Source and Ate not Available, 2 pgs.

* cited by examiner

MOS TRANSISTOR GATES WITH THIN LOWER METAL SILICIDE AND METHODS FOR MAKING THE SAME

RELATED APPLICATIONS

This application is related to U.S. patent application Ser. No. 10/674,771, filed on Sep. 30, 2003, entitled MOS TRANSISTOR GATES WITH DOPED SILICIDE AND METHODS FOR MAKING THE SAME; U.S. patent application Ser. No. 10/661,130, filed on Sep. 12, 2003, entitled METAL GATE MOS TRANSISTORS AND METHODS FOR MAKING THE SAME; and U.S. patent application Ser. No. 10/302,212, filed Nov. 22, 2002, entitled MULTIPLE WORK FUNCTION GATES, wherein the entirety of these applications are hereby incorporated by reference as if fully set forth herein.

FIELD OF INVENTION

The present invention relates generally to semiconductor devices and more particularly to fabricating a transistor gate structure with multiple metal silicides.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFETs), wherein a gate contact or electrode is energized to create an electric field in a channel region of a semiconductor body, by which electrons are allowed to travel through the channel between a source region and a drain region of the semiconductor body. The source and drain regions are typically formed by adding dopants to targeted regions on either side of the channel. A gate dielectric or gate oxide is formed over the channel, and a gate electrode or gate contact is formed over the gate dielectric. The gate dielectric and gate electrode layers are then patterned to form a gate structure overlying the channel region of the substrate.

In operation of the resulting MOS transistor, the threshold voltage (Vt) is the gate voltage value required to render the channel conductive by formation of an inversion layer at the surface of the semiconductor channel. Complementary MOS (CMOS) devices have become widely used in the semiconductor industry, wherein both n-channel and p-channel (NMOS and PMOS) transistors are used to fabricate logic and other circuitry. For enhancement-mode (e.g., normally off) devices, the threshold voltage Vt is positive for NMOS and negative for PMOS transistors. The threshold voltage is dependent upon the flat-band voltage, where the flat-band voltage depends on the work function difference between the gate and the substrate materials, as well as on surface charge.

The work function of a material is a measure of the energy required to move an electron in the material outside of a material atom from the Fermi level, and is usually expressed in electron volts (eV). For CMOS products, it is desirable to provide predictable, repeatable, and stable threshold voltages for both NMOS and PMOS transistors. To establish Vt values, the work functions of the PMOS and NMOS gate contact and the corresponding channel materials are independently tuned or adjusted through gate and channel engineering, respectively. Channel engineering typically involves shallow dopant implants to the prospective channel regions of the semiconductor body, sometimes referred to as threshold adjust (Vt adjust) implants, where the implanted impurities behave as a sheet of fixed charge located under the gate oxide. A Vt adjust implant for the NMOS devices introduces boron or other p-type impurities into the NMOS channel region to raise the channel work function (sometimes referred to as a VTN implant), and a Vt adjust implant for the PMOS devices introduces arsenic, phosphorus, or other n-type impurities to lower the PMOS channel work function (VTP implant). In this manner, the Vt for the channels can be separately adjusted for NMOS and PMOS devices, wherein the channel engineering may include multiple implants.

Gate engineering is employed in combination with channel engineering to adjust the work function of the gate contact materials, where different gate work function values are set for PMOS and NMOS gates. The need to independently adjust PMOS and NMOS gate work functions has made polysilicon attractive for use as gate contact material in CMOS processes, since the work function of polysilicon can be easily raised or lowered by doping the polysilicon with p-type or n-type impurities, respectively. The PMOS polysilicon gates are doped with p-type impurities and NMOS gate polysilicon is doped with n-type dopants, typically during implantation of the respective source/drain regions following gate patterning. In this way, the final gate work functions are typically near the Si conduction band edge for NMOS and near the valence band for PMOS. The provision of dopants into the polysilicon also has the benefit of increasing the conductivity of the gate contact. Polysilicon has thusfar been widely used in the fabrication of CMOS devices, wherein the gate engineering (e.g., implants) are conventionally tuned to provide a desired gate contact conductivity (e.g., sheet resistance value), and the threshold voltage fine tuning is achieved by tailoring the Vt adjust implants to change the channel work function.

FIG. 1 illustrates a conventional CMOS fabrication process 10 beginning at 12, in which front end processing is performed at 14, including well formation and isolation processing. At 16 and 18, channel engineering is performed (e.g., Vt adjust, punch-thru, and channel stop implants) for PMOS and NMOS regions, respectively. A thin gate dielectric and an overlying polysilicon are formed at 20 and 22, respectively, and the polysilicon is patterned at 24 to form gate structures for the prospective NMOS and PMOS transistors. The gate structures are then encapsulated at 26, typically through oxidation, and highly-doped drain (HDD) implants are performed at 28 to provide p-type dopants to prospective source/drains of the PMOS regions and n-type dopants to source/drains of the NMOS regions, using the patterned gate structures and isolation structures as an implantation mask. Sidewall spacers are then formed at 30 along the lateral sidewalls of the gate structures At 32, the PMOS source/drain regions and the PMOS polysilicon gate structures are implanted with p-type dopants to further define the PMOS source/drains, and to render the PMOS gates conductive. Similarly, the NMOS source/drain regions and the NMOS polysilicon gate structures are implanted at 34 with n-type dopants, further defining the NMOS source/drains and to rendering the NMOS gates conductive. Thereafter, the source/drains and polysilicon gates are silicided at 36 and back end processing (e.g., interconnect metalization, etc.) is performed at 38, before the process 10 ends at 40. In the conventional process 10, the channel engineering implants at 16 and 18 shift the work functions of the PMOS and NMOS channel regions, respectively, to compensate for the changes in the PMOS and NMOS polysilicon gate work functions resulting from the source/drain implants at 32 and 34, respectively. In this manner, the desired work function difference between the gates and channels, and hence the desired threshold voltages, may be achieved for the resulting PMOS and NMOS transistors.

The gate dielectric or gate oxide between the channel and the gate contact is an insulator material, typically $SiO_2$ or other dielectric, that operates to prevent large currents from flowing from the gate contact into the channel when a voltage is applied to the gate electrode. The gate dielectric also allows an applied gate voltage to establish an electric field in the channel region in a controllable manner. Continuing trends in semiconductor product manufacturing include reduction in electrical device feature sizes (scaling), as well as improvements in device performance in terms of device switching speed and power consumption. MOS transistor performance may be improved by reducing the distance between the source and the drain regions under the gate electrode of the device, known as the gate or channel length, and by reducing the thickness of the layer of gate oxide that is formed over the semiconductor surface.

However, there are electrical and physical limitations on the extent to which $SiO_2$ gate dielectrics can be made thinner. These include gate leakage currents tunneling through the thin gate oxide, limitations on the ability to form very thin oxide films with uniform thickness, and the inability of very thin $SiO_2$ gate dielectric layers to prevent dopant diffusion from the gate polysilicon into the underlying channel. Accordingly, recent scaling efforts have focused on high-k dielectric materials having dielectric constants greater than that of $SiO_2$, which can be formed in a thicker layer than scaled $SiO_2$, and yet which produce equivalent field effect performance. A thicker high-k dielectric layer can thus be formed to avoid or mitigate tunneling leakage currents, while still achieving the required electrical performance equivalent (e.g., capacitance value) of a thinner $SiO_2$.

Another shortcoming of scaled CMOS devices having polysilicon gate contacts is known as poly depletion. Poly depletion occurs when annealing or other thermal back end processing following the implants at 32 and 34 is insufficient to drive the implanted impurities down the entire depth of the polysilicon gate structures. In this situation, a bottom portion of the polysilicon gate contact near the gate dielectric is "depleted" of charges, and acts as an insulator. The depleted portion of the gate contact and the gate dielectric operate as series connected capacitors, resulting in a reduced effective gate capacitance, which reduces the drive current capability of the device. Consequently, poly depletion causes reduction in device performance, which leads to poor unscalable devices. Simply increasing the implant energy and/or anneal time to combat poly depletion has adverse results, in that the corresponding depths of the concurrently implanted source/drain regions are increased. With the relatively thick gate dielectrics and gate contact structures of the past, poly depletion was not a critical impediment to achieving desired device performance. However, as gate dielectrics and gate contacts continue to become smaller through scaling, the poly depletion problem is more pronounced, wherein poly depletion regions of 2 to 4 angstroms become a significant fraction of the overall effective gate capacitance.

Thus, while polysilicon gate contacts have previously offered flexibility in providing dual work functions for CMOS processes, the future viability of conventional polysilicon gate technology is lessened as scaling efforts continue. Accordingly, attention has recently been directed again to the possibility of using metal gate electrodes in CMOS products, where the metal gate materials conceivably do not need doping for conductivity improvement. Although this approach presumably avoids poly depletion issues with respect to gate capacitance, there remains a need for dual or differentiated work function capability (e.g., for PMOS and NMOS transistors) in CMOS processes. In this regard, metal work functions are not shifted as easily by the same amounts as was the case for polysilicon. One proposed metal gate approach involves fully or completely siliciding the gate polysilicon overlying the gate dielectric in order to avoid poly depletion (e.g., sometimes referred to as "full silicidation"). However, full gate electrode silicidation consumes a large amount of the substrate silicon in the source/drains. Creating separate silicidation process steps for the gate electrode and the source/drains complicates the manufacturing process. Accordingly, there is a need for improved CMOS transistor gate fabrication techniques and structures by which the benefits of scaling can be achieved without excessive source/drain silicon consumption, while avoiding or mitigating the poly depletion problems found in conventional devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention relates to semiconductor fabrication techniques, in which transistor gate structures are created using upper and lower metal silicides. The lower silicide can be separately tailored through material selection and/or implantation to set the gate work functions for NMOS and PMOS transistors, while the upper silicide is tailored to provide low gate electrode sheet resistivity. In one example, the lower silicide is formed by depositing a thin first silicon-containing material, such as polycrystalline or amorphous silicon or silicon germanium over the gate dielectric, which is implanted and then reacted with a first metal by annealing to form the lower silicide. The use of a thin polysilicon facilitates tailored implantation therein to provide dopants in the resulting lower silicide at or near the interface with the underlying gate dielectric, and thus facilitates precise control over transistor gate work functions for both NMOS and PMOS devices and minimizing polysilicon depletion. A capping layer can be formed over the first metal prior to annealing, to prevent oxidation before silicidation annealing, and a barrier layer can be formed over the lower silicide to prevent reaction with subsequently formed silicon material. In another example, the lower silicide is a multilayer silicide structure including a plurality of metal silicide sublayers, which can further facilitate control of dopant concentrations and profiles in setting the gate work function.

In one aspect of the invention, a method is provided for fabricating transistor gate structures in a semiconductor device, comprising forming a thin first silicon-containing material above a gate dielectric, where the thickness of the first silicon-containing material is about 300 Å or less. A first metal is formed over the first silicon-containing material, and the first metal is reacted with the first silicon-containing material, such as through annealing, to form a first metal silicide above the gate dielectric. The method further comprises forming a second silicon-containing material above the first metal silicide, and selectively etching portions of the second silicon-containing material and the first metal silicide to form a patterned gate structure above the gate dielectric. A second metal is formed over the second silicon-containing material, and the second metal is reacted with the second silicon-containing material to form a second metal silicide above the first metal silicide.

In another aspect of the invention, a capping layer, such as a metal is formed over the first metal before reacting with the first silicon-containing material. The capping layer inhibits oxidation or other degradation of the first metal, such as during transfer from a sputter deposition chamber to an annealing tool for silicidation. Still another aspect of the invention provides for removal or stripping of the capping layer and any unreacted first metal material after reacting the first metal with the first silicon-containing material and before forming the second silicon-containing material. In another aspect, the method includes forming a barrier layer over the first metal silicide after removing the capping layer and any unreacted first metal material and before forming the second silicon-containing material. The barrier may be a metal nitride or other suitable material that inhibits degradation of the lower metal silicide. For example, where a metal-rich lower silicide is formed, the barrier can prevent undesired silicidation with the second silicon-containing material that is formed thereover, thus preserving the lower silicide composition and inhibiting atomic migration between the upper and lower silicides.

Yet another aspect of the invention involves gate fabrication methods and transistor gate structures wherein the lower gate silicide is a multilayer structure for setting the gate work function, with an upper silicide for controlling the gate sheet resistivity. The multilayer lower metal silicide stack comprises a plurality of thin metal silicide sublayers, such as a few monolayers up to several tens of angstroms thick, wherein the formation and doping of thin silicide sublayers can be fine tuned according to a desired lower silicide work function. The sublayers can be individually created by forming a silicon-containing material over the gate dielectric or over a preceding sublayer, forming a metal over the silicon-containing material, and reacting the metal with the silicon-containing material to form a metal silicide sublayer, wherein the total thickness of the multilayer silicide stack can be about 300 Å or less. The individual silicon-containing layers can be doped by implantation prior to silicidation annealing. Moreover, the individual sublayers can be formed using the same or different silicon-containing materials, and/or the same or different metals, and can be individually protected with capping layers formed over the metal layers prior to sublayer silicidation annealing, and/or with barrier layers formed over the individual sublayers after the individual anneals. Alternatively, a single barrier layer can be formed over the completed multilayer structure to inhibit adverse interaction with subsequently formed silicon overlying the multilayer lower silicide.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
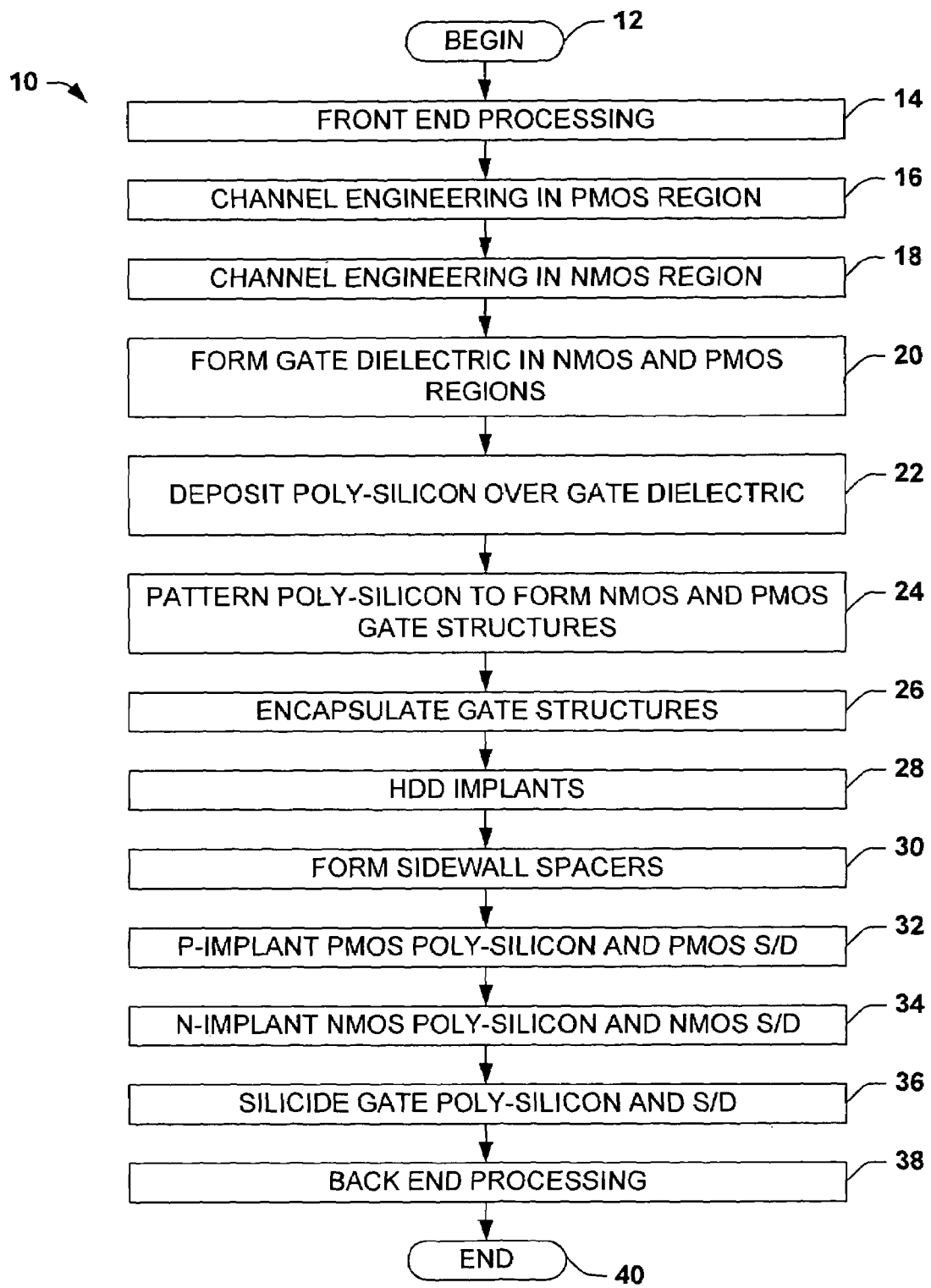
FIG. 1 is a simplified flow diagram illustrating a conventional CMOS transistor fabrication process using polysilicon to form transistor gate electrodes.

One or more implementations of the present invention will now be described with reference to the attached drawings, wherein like reference numerals are used to refer to like elements throughout, and wherein the illustrated structures are not necessarily drawn to scale. The invention relates to transistor gate structures and fabrication methods therefor, in which two or more suicides are used to form the gate electrode or gate contact. Several implementations of the invention are hereinafter illustrated and described in which a first or lower metal silicide is formed using polysilicon and a refractory metal, either as a single first suicide or a multilayer lower silicide stack structure. However, any silicon-containing materials and metals may be employed in creating metal silicide materials, wherein the invention is not limited to the specific materials and structures illustrated and described herein.

Figure 2A:
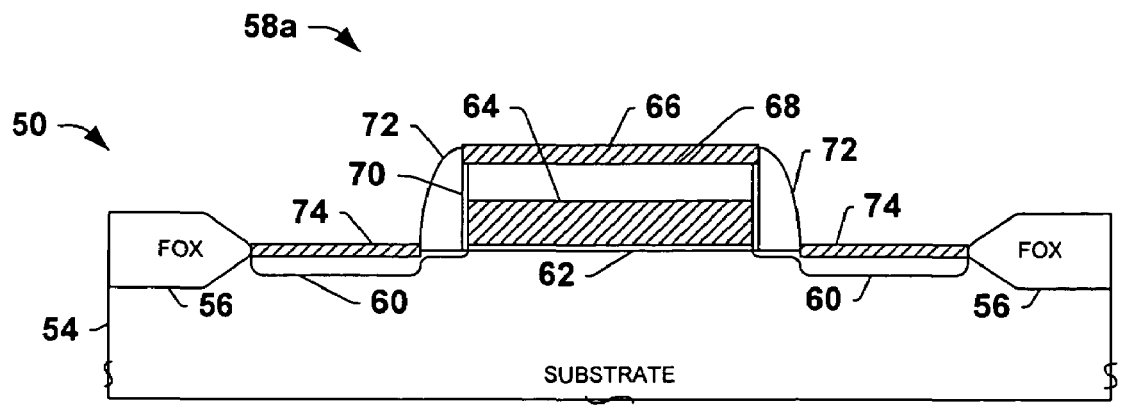
FIGS. 2A–2C are partial side elevation views in section illustrating exemplary MOS transistors having gate structures with first and second metal silicides fabricated in accordance with one or more aspects of the present invention.
Figure 2B:
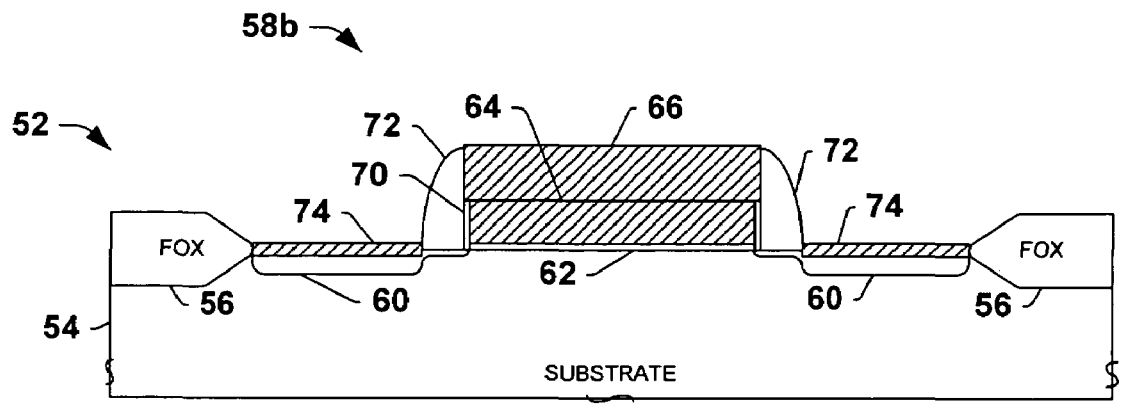
Figure 2C:
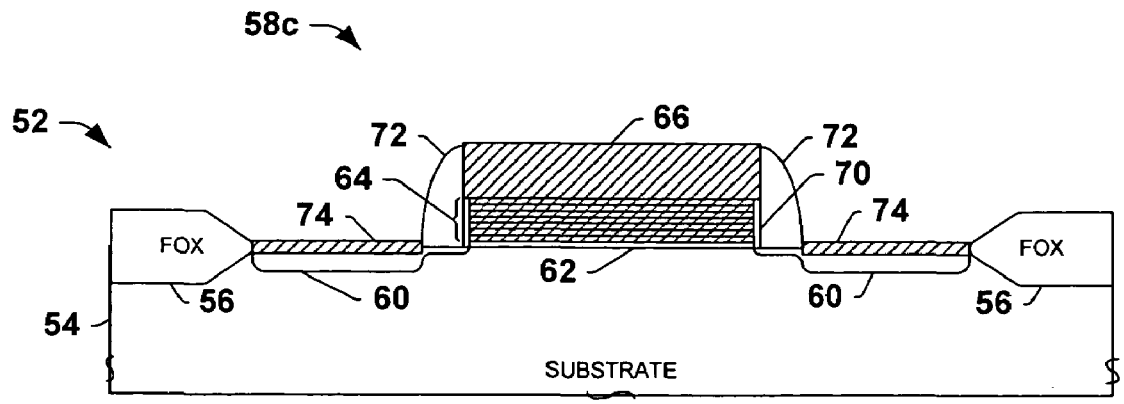

FIGS. 2A–2C illustrate exemplary CMOS semiconductor devices 50 and 52, with NMOS transistors 58a–58c, respectively, having gate structures fabricated in accordance with the invention. While NMOS transistors 58 are illustrated in FIGS. 2A–2C, the aspects of the invention are also applicable to PMOS structures, as illustrated and described further below. The devices 50, 52 are fabricated in or on a silicon substrate 54, although the invention may be carried out in association with SOI wafers, epitaxial silicon layers formed over silicon wafers, or any other semiconductor body. N-wells, p-wells, and/or buried layers (not shown) may be formed in the substrate 54, and the substrate 54 may be initially doped with p-type or other impurities. The NMOS transistors 58a–58c include field oxide (FOX) isolation structures 56, and n-doped source/drains 60.

The devices 50 and 52 include MOS transistor gate structures, comprising a gate dielectric layer 62 formed above a channel region of the substrate 54, a thin n-doped first or lower metal silicide 64 above the gate dielectric 62 for setting the gate work function, and a second or upper metal silicide 66 above the first metal silicide 64 for low contact sheet resistance. The exemplary gate structures of FIGS. 2A–2C have a total thickness on the order of about 1000 Å or less, although thicker gate structures may be created according to the methods of the invention. In accordance with an aspect of the invention, the lower metal suicides 64 are thin, preferably formed by reacting a thin first silicon containing material with a metal, where the first silicon-containing material is formed to about 300 Å or less, preferably about 200 Å or less. The transistor 58a in FIG. 2A includes a doped polysilicon layer 68 between the first and second metal suicides 64 and 66, wherein a portion of the silicon 68 is reacted with nickel or other metal in forming the upper silicide 66.

Alternatively, polysilicon or other silicon-containing material (not shown) may be deposited above the first silicide 64 in the device 52, the entirety of which is consumed in forming the second silicide 66, leaving the upper and lower silicide gate structures of FIGS. 2B and 2C. The transistor 58c in FIG. 2C includes a multilayer lower metal silicide stack 64 comprising a plurality of metal silicide sublayers, over which the upper silicide 66 is formed. The gate structures in the devices 50 and 52 have sidewalls over which an encapsulation oxide or other material 70 is formed, and along which sidewall spacers 72 are formed. Silicide source/drain contacts 74 are formed over the source/drains 60, wherein the upper gate silicide 66 may be formed separately or concurrently with formation of the source/drain silicide contacts 74.

In the illustrated devices 50 and 52, the first and second metal suicides 64 and 66, respectively, are different, wherein the first metal silicide 64 comprises a refractory metal such as molybdenum, tungsten, tantalum, titanium, hafnium, or others, while the second metal silicide 66 comprises nickel. Alternatively, the first and second metal silicides 64 and 66 can be the same type and/or can comprise any suitable metal within the scope of the invention. However, the inventors have appreciated that the use of refractory metal silicides, such as $MoSi_2$ or others comprising W, Ti, Ta, etc., for the lower metal silicide 64 provides high melting temperatures to withstand fabrication processing, as well as the ability to be separately tuned by implantation for setting NMOS and PMOS gate work functions. In this regard, nickel or other second silicides 66 provide low resistivity, wherein the second silicide 66 may be formed later in a fabrication flow, and thus will only be exposed to relatively lower temperature back end processing.

The dopants in the first metal silicide 64 of NMOS and PMOS transistor gate structures can be separately tailored for setting the respective gate work functions in accordance with the invention, thereby facilitating threshold voltage tuning while simplifying or eliminating channel engineering steps and avoiding polysilicon depletion troubles of conventional CMOS devices. In this regard, the metal used in forming the lower silicide 64 may be the same for both PMOS and NMOS type transistors gates, with different dopants being employed to set the respective work functions, or the lower silicides 64 may be formed using different metals for NMOS and PMOS devices.

Figure 3:
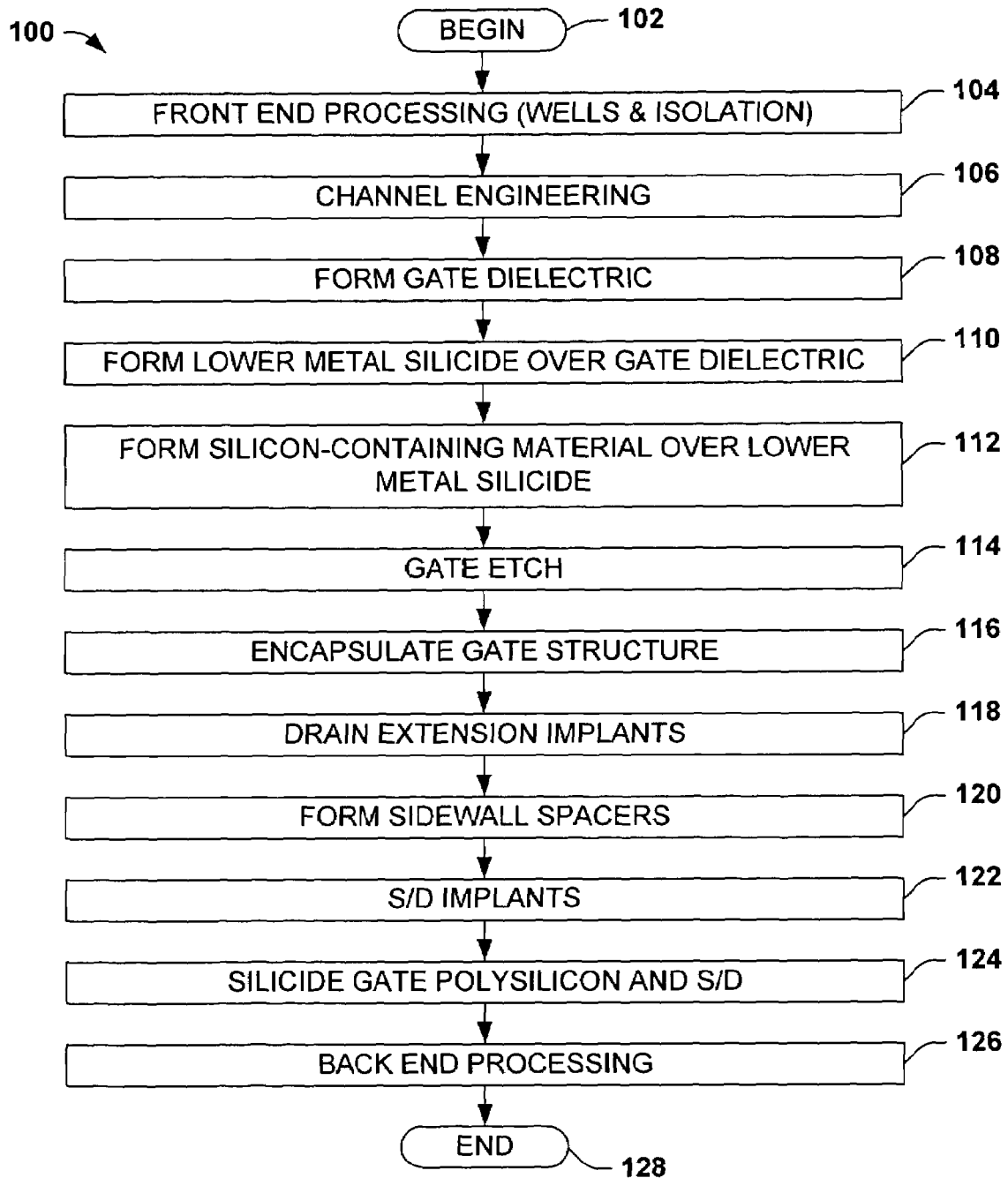
FIG. 3 is a flow diagram illustrating an exemplary method of fabricating semiconductor devices having PMOS and NMOS gate structures in accordance with the invention.
Figure 4:
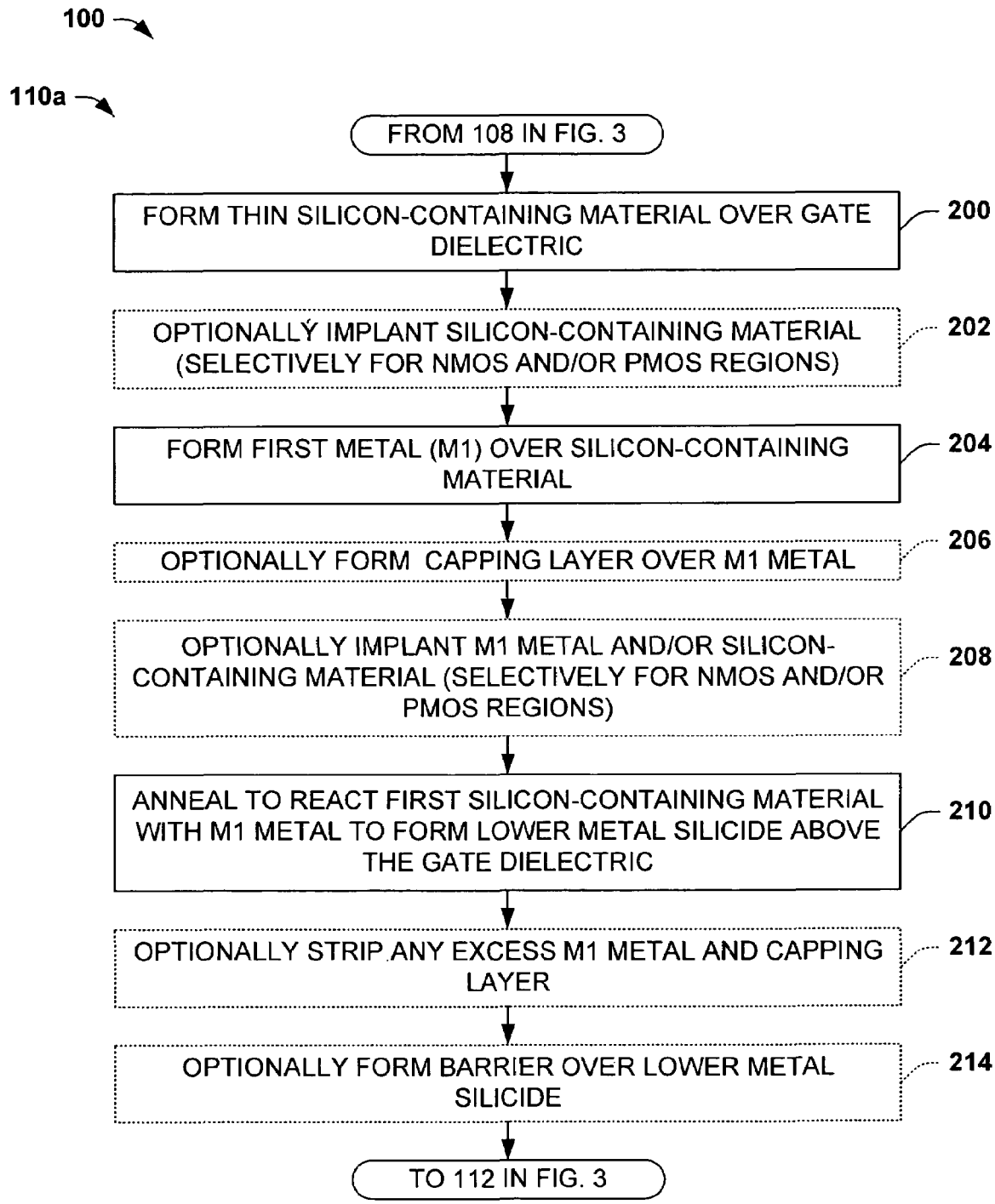
FIG. 4 is a partial flow diagram illustrating further details of the lower gate silicide formation according to one exemplary implementation of the method of FIG. 3.
Figure 6:
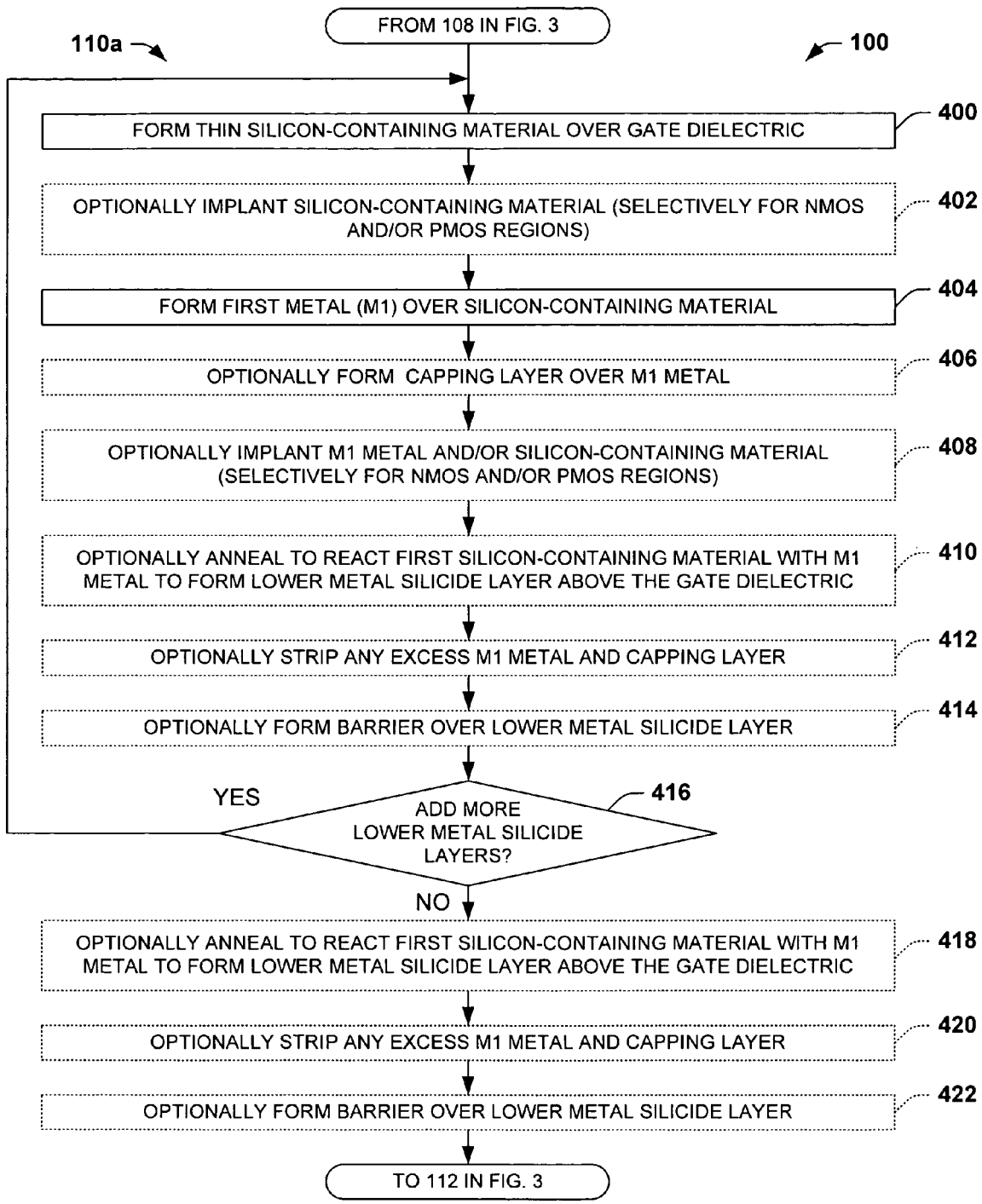
FIG. 6 is a partial flow diagram illustrating further details of another exemplary implementation of the method of FIG. 3, in which a multilayer lower silicide stack is formed according to the invention.

Referring now to FIGS. 3, 4, and 6, the invention provides methods for fabricating transistor gate structures in a semiconductor device, in which upper and lower metal silicides are formed in transistor gate structures. FIG. 3 illustrates an exemplary method 100 in accordance with various aspects of the invention, wherein the details of various implementations of the lower metal silicide formation are set forth in FIGS. 4 and 6. While the exemplary method 100 of FIGS. 3, 4, and 6 and other methods of the invention are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Further, the methods according to the present invention may be implemented in association with the formation and/or processing of structures illustrated and described herein as well as in association with other structures and devices not illustrated.

The method 100 begins at 102 in FIG. 3, wherein front end processing is performed at 104. Any front end processing may be performed at 104, for example, including formation of n and p wells using diffusion, implantation, or other suitable processing steps, as well as formation of isolation structures in field regions of a semiconductor body, using LOCOS, STI, or any suitable isolation processing. Channel engineering (e.g., channel doping or implantation) is performed at 106 to adjust the work function of a channel portion of the semiconductor body in prospective NMOS and/or PMOS active regions. The channel engineering at 106 which may include, for example, a shallow Vt adjust implant to introduce boron or other p-type dopants into the NMOS channel regions with the PMOS regions masked to raise the NMOS channel work function. In addition, a boron punch-thru implant may be performed at 106 to suppress punch-through, along with a somewhat deeper boron channel stop implant in the NMOS regions. Similar channel engineering may be performed at 106 to provide n-type dopants (e.g., arsenic, phosphorus, etc.) to the PMOS regions with the NMOS regions masked.

A gate dielectric is formed at 108 in the NMOS and PMOS regions using any suitable materials, material thicknesses, and processing steps, including a single thermal oxidation or deposition or combinations thereof to form a gate dielectric above the semiconductor body. The invention may be employed in conjunction with any gate dielectric material, such as $SiO_2$, SiON, high-k dielectrics, and stacks or combinations thereof, wherein separate processing may optionally be employed at 108 to form different gate dielectrics in the NMOS and PMOS regions within the scope of the invention. In the examples illustrated and described herein, a single thermal oxidation is performed at 108 to create a thin $SiO_2$ or gate oxide overlying the substrate in the NMOS and PMOS regions.

Gate electrode structures having a thin first or lower metal silicide are then formed in accordance with the present invention, with the general transistor fabrication processing being illustrated in FIG. 3, and several exemplary first metal silicide fabrication implementations being illustrated in FIGS. 4 and 6. At 110 of FIG. 3, a thin first metal silicide is formed over the gate dielectric (e.g., lower metal silicide 64 in FIGS. 2A–2C above), for example, by forming a thin first silicon-containing material and a thin first metal, and annealing to form a first metal silicide. N-type and p-type dopants can be selectively introduced into the first metal silicide of the NMOS and PMOS regions, respectively, using any suitable techniques, including but not limited to implantation and/or diffusion, wherein such dopants may be introduced before and/or after silicidation of a first metal with the first silicon-containing material. FIGS. 4 and 6 illustrate several exemplary implementations of first metal silicide fabrication at 110 in accordance with various aspects of the invention.

At 112, a second silicon-containing material is formed above the first metal silicide in the NMOS and PMOS regions, some or all of which may subsequently be consumed in forming a second or upper metal silicide above the first metal silicide. The second silicon-containing material may, but need not, be n-doped or p-doped in the NMOS and PMOS regions, respectively. Any suitable material formation technique may be employed to create the second silicon-containing material at 112, for example, chemical vapor deposition (CVD) processes, etc. The silicon-containing material may be formed at 112 directly over the first metal silicide or may be formed over one or more intervening material layers, such as barrier layers discussed below, within the scope of the invention. The second silicon-containing material (e.g., and the first silicon-containing material used in forming the first metal silicide) can be any material with a silicon content, such as polycrystalline silicon (e.g., poly) that is CVD deposited above the first metal silicide, amorphous silicon, silicon germanium (e.g., SiGe), or other silicon-containing material within the scope of the invention. Furthermore, the first and second silicon-containing materials may, but need not, be the same.

At 114, the second silicon-containing material and the first metal silicide are selectively etched to form patterned gate structures using any suitable techniques, for example, such as anisotropic reactive ion etching (RIE) with suitable etch masks. The patterned gate structures are then optionally encapsulated at 116 using any suitable materials and processing steps, for example, a reoxidation process. Drain extension implants (e.g., HDD, LDD, MDD implants, etc.) are performed at 118 to introduce p-type dopants (e.g., boron, etc.) into prospective PMOS source/drains and extension regions and to provide n-type dopants (e.g., arsenic, phosphorus, etc.) to prospective NMOS source/drains. Any suitable processing steps and operational parameters may be employed for the drain extension implants at 118, wherein the patterned gate structures and isolation structures operate as implantation masks. The drain extension implants at 118 also provide n-type dopants to the second silicon-containing material in the NMOS regions and p-type dopants to the second silicon-containing material in the PMOS regions in the illustrated example, although the gate second silicon-containing material layers can alternatively be masked during the implantation operations at 118.

Sidewall spacers are formed at 120 along the lateral sidewalls of the patterned gate structures, using any suitable process techniques and materials, for example, by depositing and etching $SiO_2$, $Si_3N_4$, etc., to form single layer or multilayer spacer structures. Source/drain implants are then performed at 122 to further dope the PMOS and NMOS source/drain regions of the semiconductor body, which may also provide dopants to the second silicon-containing material. Any suitable implantation techniques, operational settings, and implant species may be employed at 122 to render the PMOS gate silicon conductive and to further define the PMOS source/drains in the semiconductor body, wherein the n and p-type implants at 122 may be performed in any order. In addition, activation anneal operations may be performed following one or both of the source/drain implants at 122, wherein such annealing may also operate to diffuse dopants in the first silicide and the second silicon-containing material.

A self-aligned silicide (e.g., salicide) process is performed at 124 to silicide the source/drains and some or all of the second silicon-containing material of the patterned gate structure, which creates a second metal silicide above the first metal silicide of the gate stacks. In one example, nickel, cobalt, or other second metal material is deposited at 124 over the second silicon-containing material of the gate, as well as over the semiconductor body in the prospective source/drain regions. The wafer is then annealed at 124 to react the second silicon-containing material of the gate and the source/drain region silicon of the semiconductor body with the deposited second metal material to form a second metal silicide.

The first and second metal materials used in forming the upper and lower metal suicides may, but need not, be the same, for example, wherein the second metal employed at 124 can be molybdenum, tungsten, tantalum, titanium, or hafnium deposited over the second silicon-containing material. In one implementation (e.g., FIG. 2A above), a portion of the second silicon-containing material remains unreacted over the first silicide after the silicidation at 124. In another example, substantially all of the second silicon-containing material is consumed at 124, as shown in FIGS. 2B and 2C above. Thereafter interconnection (e.g., metalization) and other back end processing is performed at 126 and the method 100 ends at 128.

The second silicide can be formed anywhere above the first metal silicide of the gate structure within the scope of the invention. For example, the second silicide may be formed directly over the first metal silicide, directly over an intervening (e.g., remaining unreacted) second silicon-containing material, or one or more other materials or layers may be situated between the second silicide and the first silicide or the remaining second silicon-containing material (e.g., barrier layers as described below). As discussed above, the second silicide may be the same or may comprise different metal than the first silicide. For example, the second silicide may comprise nickel or cobalt (e.g., low resistivity, lower melting temperature), where the first metal silicide can include a refractory metal (e.g., molybdenum, tungsten, tantalum, titanium, hafnium, etc.) having a higher melting temperature, while facilitating work function adjustment. In this manner, the second silicide may provide improved (e.g., lower) gate sheet resistance, whereas the first silicide is able to withstand relatively higher processing thermal budget between the first silicide formation at 112 and the back end processing at 132. In addition, the provision of the intervening silicon over the first metal silicide (e.g., whether fully consumed at 130 or not) may advantageously protect the first metal silicide during fabrication processing.

Figure 5A:
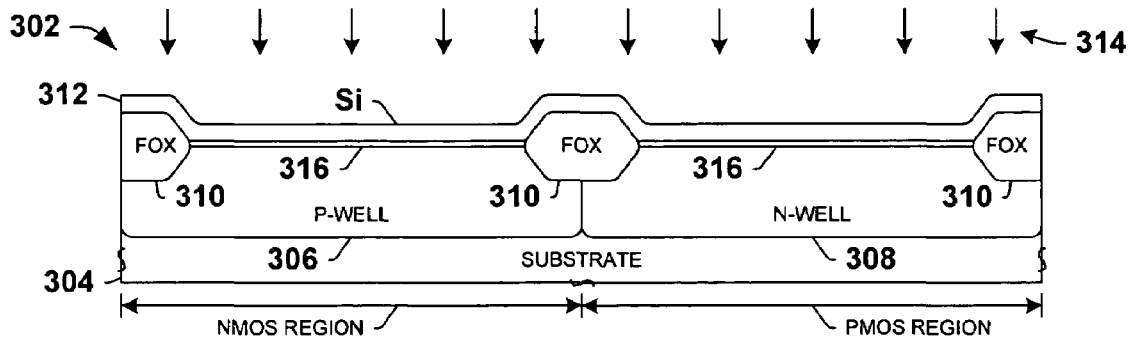
FIGS. 5A–5O are partial side elevation views in section illustrating exemplary NMOS and PMOS transistors undergoing gate and other fabrication processing in accordance with the invention.
Figure 5B:
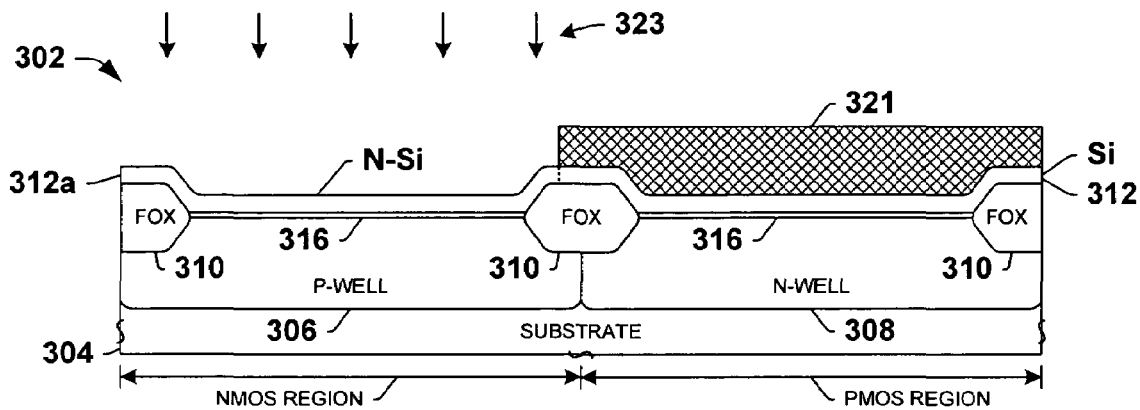
Figure 5C:
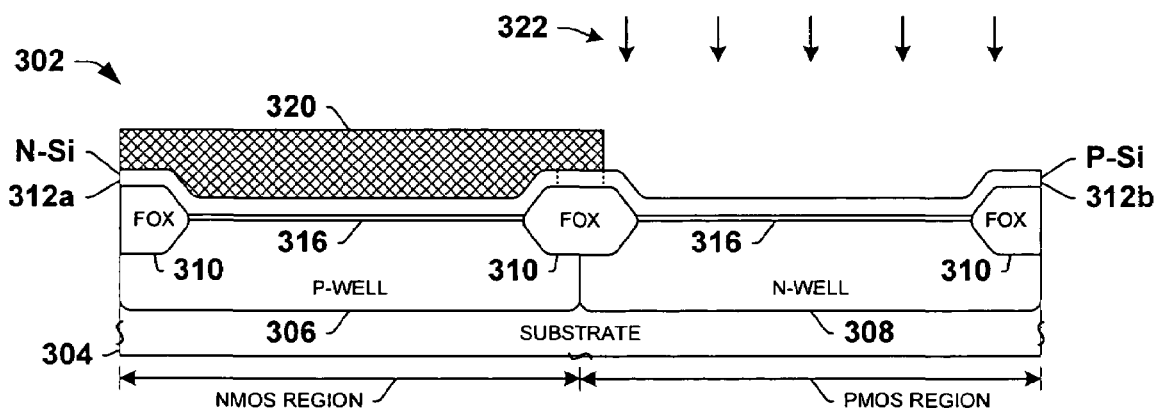
Figure 5D:
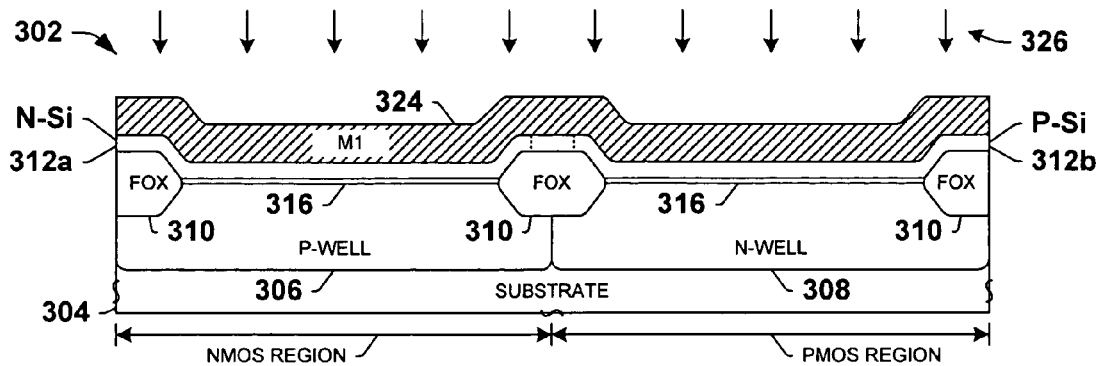
Figure 5E:
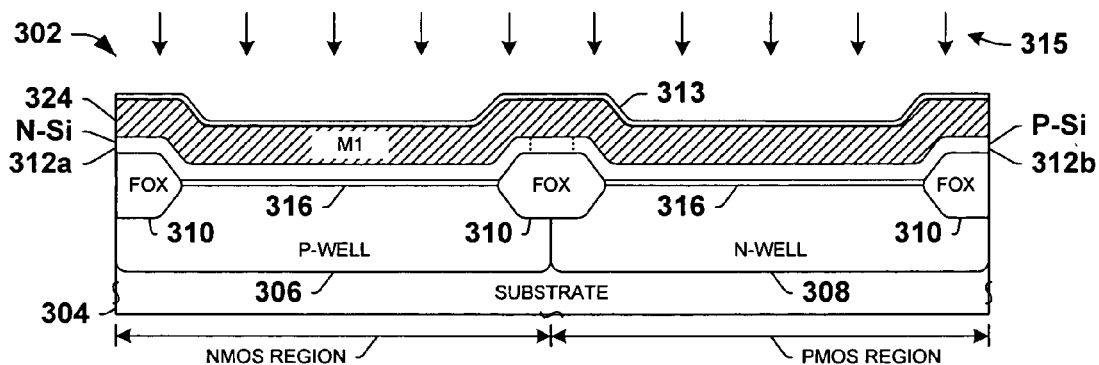
Figure 5F:
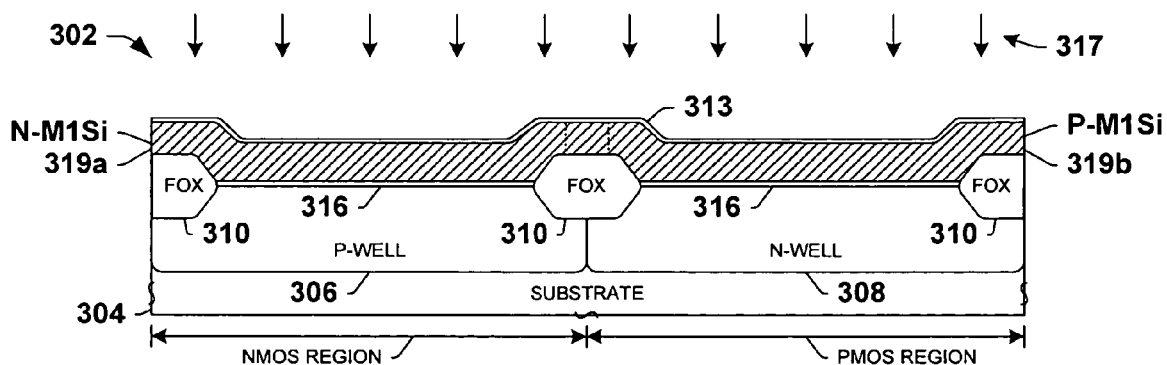
Figure 5G:
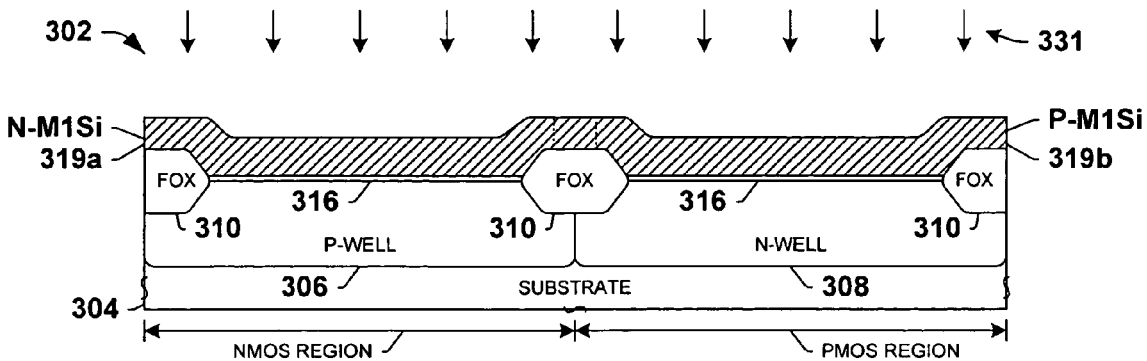
Figure 5H:
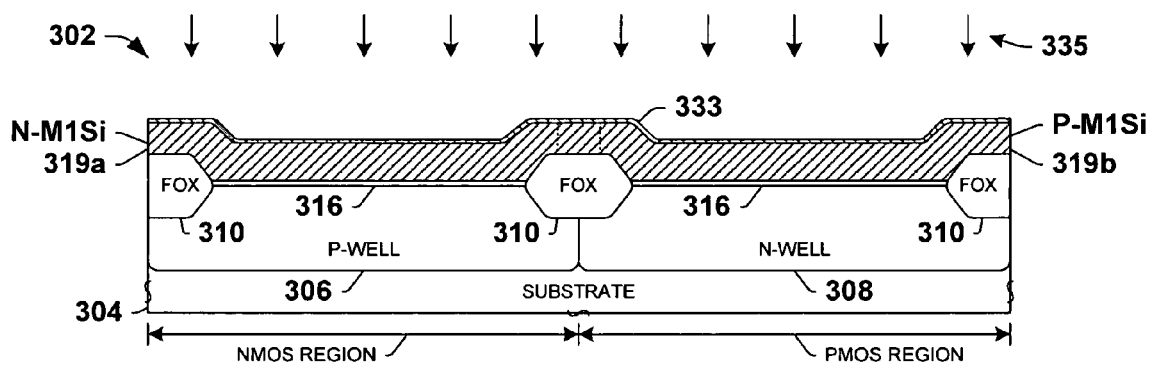
Figure 5I:
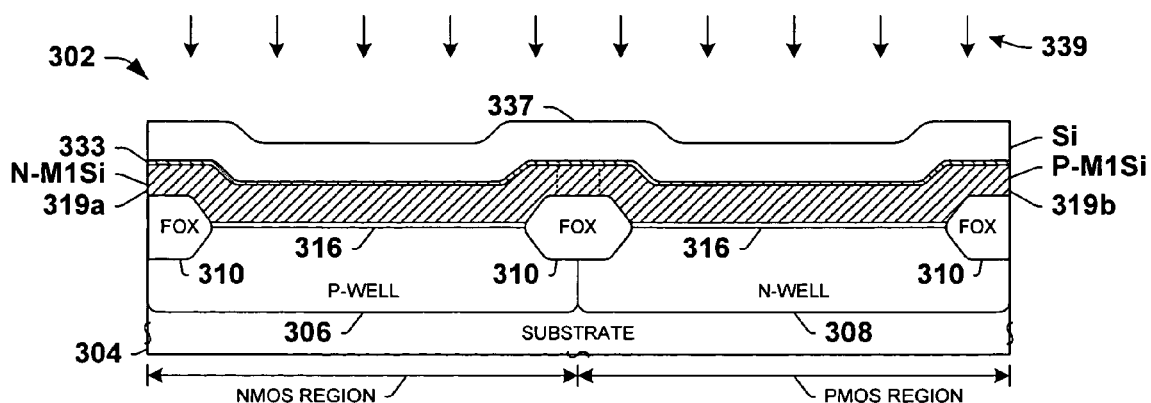
Figure 5J:
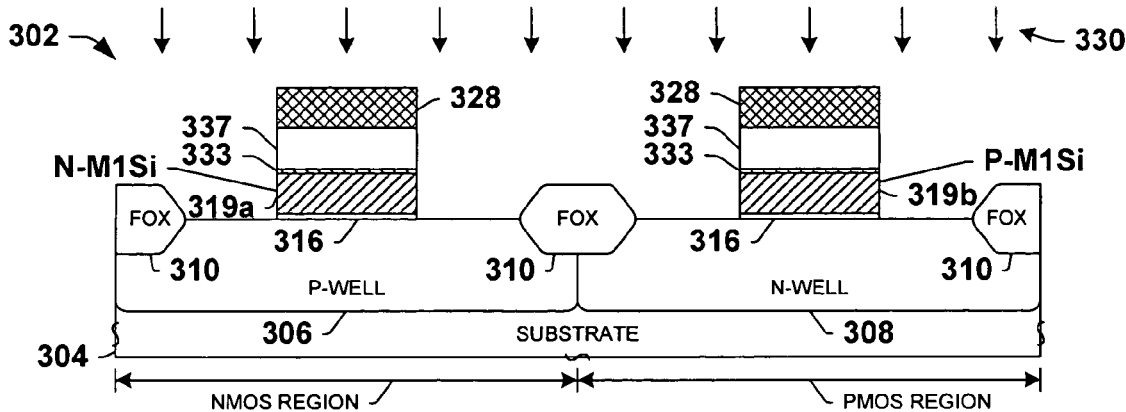
Figure 5K:
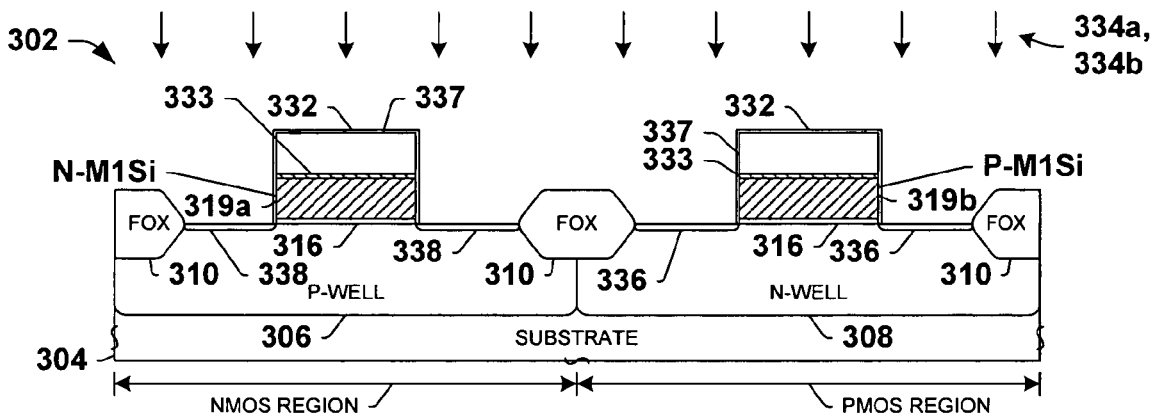
Figure 5L:
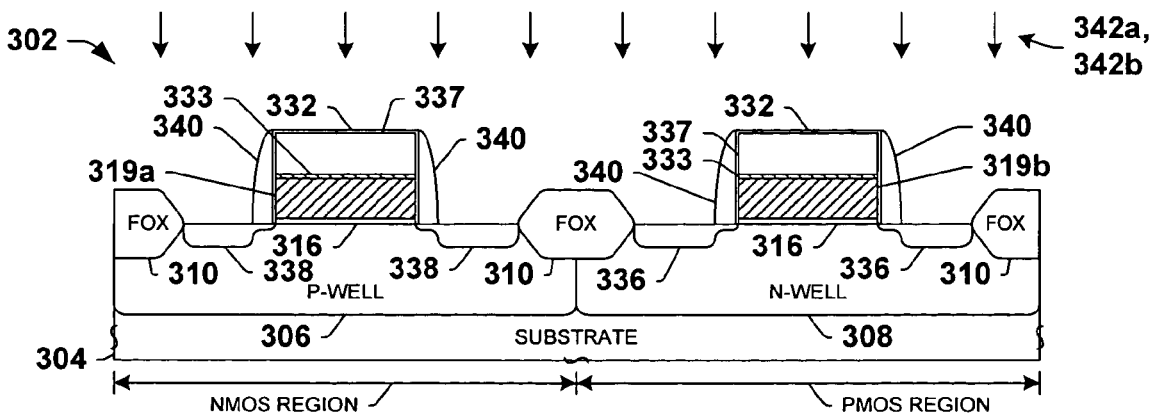
Figure 5M:
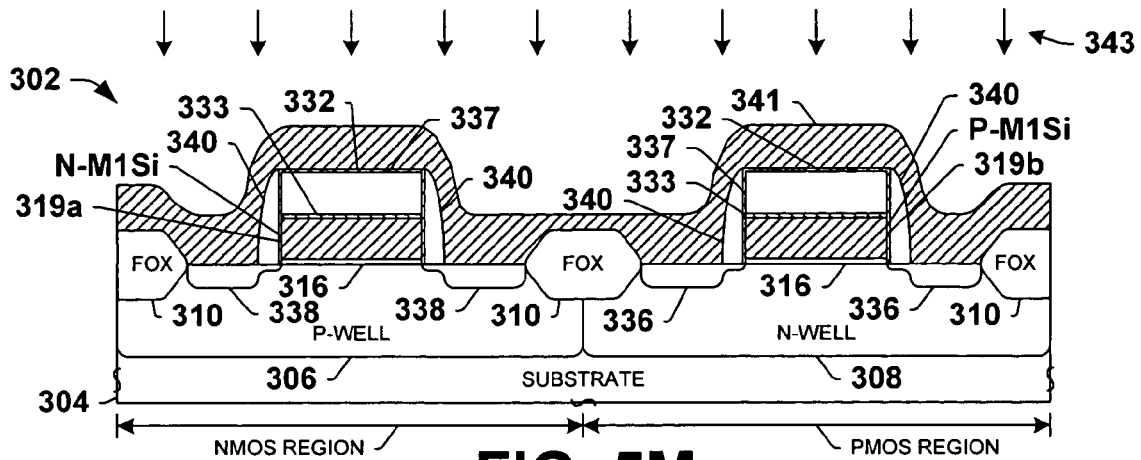
Figure 5N:
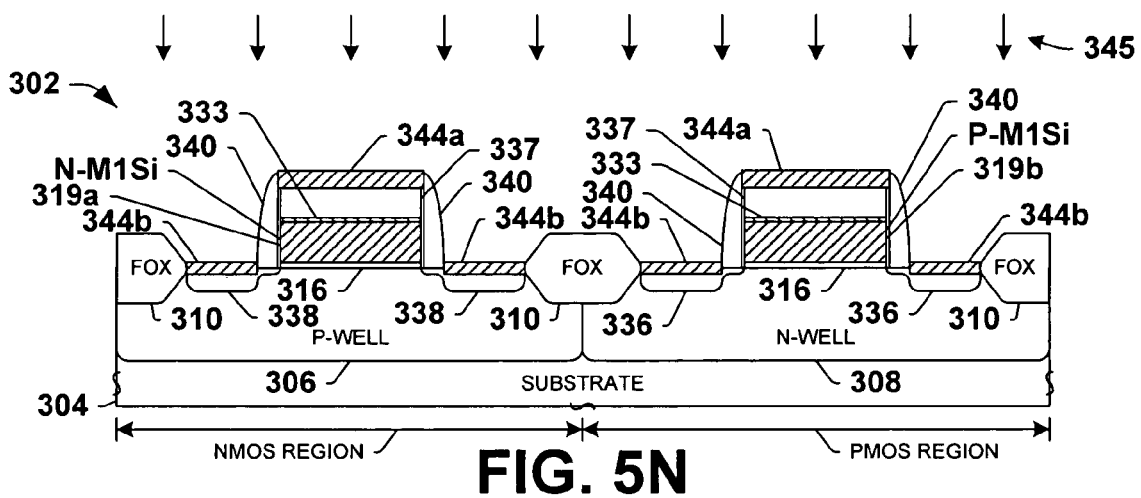
Figure 5O:
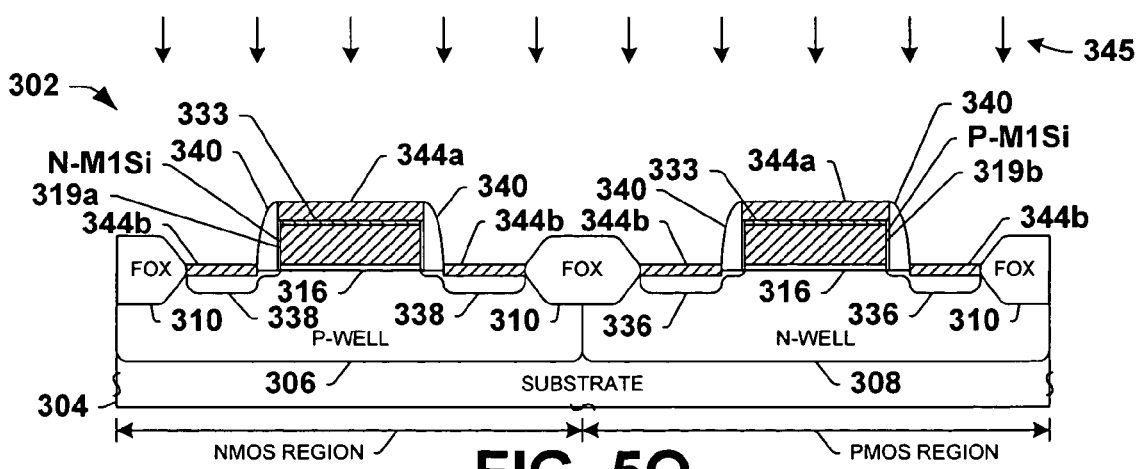

Referring now to FIGS. 3, 4, and 5A–5O, an exemplary CMOS device 302 is illustrated in FIGS. 5A–5O at various stages of fabrication processing generally according to the method 100 above, wherein FIG. 4 illustrates one possible implementation 110a of the lower metal suicide formation at 110 in FIG. 3. FIGS. 5A–5N illustrate exemplary NMOS and PMOS transistors in the device 302 undergoing processing at various stages of fabrication to form gate structures with first and second metal suicides and an intervening second silicon-containing material in accordance with the invention. FIG. 5O illustrates another possible implementation of the device 302, wherein the gate structures include first and second metal with no intervening silicon-containing material in accordance with the invention.

FIG. 5A illustrates the CMOS device 302 formed using a silicon substrate semiconductor body 304 with a p-well 306 formed in an NMOS region and an n-well 308 formed in a PMOS region, as well as field oxide (FOX) isolation structures 310. A gate dielectric 316 is formed (e.g., at 108 in FIG. 3) over the surface of the substrate 304 in NMOS and PMOS active regions of the device 302 between the FOX isolation structures 310, for example, a thermally grown SiO$_2$ oxide 316 or any other dielectric material formed by any suitable technique.

A first silicon-containing material 312 is formed over the gate dielectric 316 in NMOS and PMOS regions of the device 302 via a deposition process 314, for example, CVD deposition of polycrystalline silicon (e.g., at 200 in FIG. 4). Other silicon-containing materials 312 can be used, such as amorphous silicon, silicon germanium (SiGe), etc. In one aspect of the invention, the first silicon-containing material 312 is thin, such as having a thickness of 1 monolayer or more and about 300 Å or less, preferably about 200 Å or less. The material 312 may be formed directly over the gate dielectric 316, or one or more intervening materials may be situated between the gate dielectric 316 and the first silicon-containing material 312 within the scope of the invention. In the exemplary implementation, the polysilicon 312 is formed via low temperature CVD using silane and N2 or H2 or other inert carrier gas to form the first silicon-containing material 312 of 1 monolayer up to about 200 or 300 Å.

As illustrated in FIGS. 5B and 5C, the first silicon material 312 may be selectively doped through implantation, for example, to provide n-doped silicon 312a in prospective NMOS regions and p-doped silicon 312b in prospective PMOS regions of the device 302 (202 in FIG. 4). The optional implantation(s) help set the gate work functions of NMOS and PMOS transistors, ideally without implanted species penetrating the gate dielectric. In this regard, the use of a thin first silicon-containing material 312 facilitates suitable adjustment of the implantation parameters to achieve a desired work function, and the formation of the first silicide (e.g., in FIG. 5F below) helps avoid the poly depletion problems associated with conventional poly gate designs.

In FIG. 5B, a mask 321 is formed to cover the silicon 312 in the PMOS regions and to expose the silicon 312 in the NMOS regions. N-type dopants (e.g., P, As, etc.) are introduced via an implantation process 323 into the exposed silicon-containing material 312, thus creating n-doped silicon-containing material 312a over the gate dielectric 316 in the NMOS regions. The range of the implantation 323 can also be adjusted to dope the polysilicon near to the interface between the silicon-containing material 312a and the underlying gate dielectric 316, and/or to achieve any desired pre-silicidation dopant concentrations and profiles. The mask 321 is then removed.

In FIG. 5C, another implantation mask 320 is formed to cover the NMOS regions and to expose the PMOS regions. An implantation process 322 is performed to provide boron or other p-type dopants to the first silicon-containing material 312 in the PMOS region, thereby creating p-doped first silicon-containing material 312b over the gate dielectric 316 in the PMOS region, after which the mask 320 is removed. One or more activation anneals can be performed to activate and diffuse the implanted dopants within the first silicon-containing material 312.

In FIG. 5D, a first metal 324 (e.g., M1) is formed over the first silicon-containing material 312 (e.g., 204 in FIG. 4) via any suitable metal formation process 326, wherein the first metal can be any metal, preferably a refractory metal such as molybdenum, tungsten, tantalum, titanium, or hafnium. In the illustrated example, molybdenum 324 is sputter deposited over the poly 312 to a thickness selected according to the thickness of the poly 312 (e.g., 1 monolayer up to about 500 Å in this example), preferably such that substantially all of the first silicon-containing material 312 is consumed in the subsequent silicidation anneal at 210 of FIG. 4. It is noted at this point that the provision of the first silicon-containing material 312 over the gate dielectric 316 prevents sputtering or other metal deposition processing from degrading the gate dielectric properties, and thus provides performance advantages over depositing metal directly over the gate dielectric 316.

In FIG. 5E, an optional capping layer 313 is formed to any suitable thickness over the first metal 324 via a deposition process 315 (e.g., 206 in FIG. 4), wherein the capping layer 313 may comprise a metal. In the illustrated example, the capping layer 313 is titanium or titanium nitride formed via a sputter deposition process 315, which serves to prevent the first metal 324 from being oxidized or otherwise degraded when the device 302 is removed from a sputtering deposition chamber for implantation or annealing. An optional second implantation can be performed at 208 in FIG. 4 (e.g., either before or after the capping layer 313 is formed), to initially dope the first metal 324 and/or the first silicon-containing material 312, or to complement the preceding implantation of the silicon-containing material 312 at 202.

In FIG. 5F, the first metal 324 and the first silicon-containing material 312 are reacted (210 in FIG. 4) via a thermal anneal process 317 to form n-doped first metal silicide 319a and p-doped first metal silicide 319b in the NMOS and PMOS regions, respectively (collectively first metal silicide 319). Any suitable anneal process 317 may be employed to react the first metal 324 with the first silicon-containing material 312 within the scope of the invention. As illustrated and described further below with respect to FIGS. 6–7O, the first metal silicide 319 may alternatively be formed as a multilayer silicide structure comprising a plurality of individually formed metal suicides above the gate dielectric 312. The metal 324 and silicon 312 are preferably reacted such that substantially all of the silicon-containing material 312 is consumed while leaving little or no remaining (e.g., unreacted) first metal material 324. Any such remaining first metal material 324 and the optional capping layer 313 (if used) can optionally be removed in FIG. 5G (212 in FIG. 4) via a stripping process 331 to prevent any such remaining unreacted metal 324 from forming unintended silicide with the subsequently deposited second silicon-containing material (e.g., FIG. 5I below).

In accordance with another aspect of the invention, an optional barrier layer 333 can be formed in FIG. 5H via a deposition process 335 (214 in FIG. 4) over the lower metal silicide 319, for example, a metal nitride deposited via a sputter deposition process 335. In one possible implementation, the metal nitride barrier is formed using the same metal 324 (e.g., M1) as was used in forming the first metal silicide 319 (e.g., molybdenum in the illustrated device 302), although other metals may be used, for example, transition metals. The barrier layer 333 operates to prevent the first metal silicide 319 from reacting with subsequently deposited second silicon-containing materials (e.g., 112 of FIG. 3). For instance, where a metal-rich first metal suicide 319 is formed, reaction thereof with a subsequently deposited second polysilicon may result in migration of silicon into the first metal silicide 319, thereby changing the properties thereof, which in turn may adversely affect the resulting transistor gate work function.

Thereafter in FIG. 5I, a second silicon-containing material 337 is formed (214 in FIG. 3) above the first metal silicide 319 (e.g., over any optional barrier layer 333). The second silicon-containing material 337 can be any material having a silicon content, such as polycrystalline or amorphous silicon, silicon germanium, or other silicon-containing material 337, and can be formed using any suitable deposition process 339 (e.g., CVD). In FIG. 5J, a gate etch mask 328 is formed and the exposed portions of the second silicon-containing material 337 and the first metal silicide 319 are selectively etched via an RIE or other etch process 330 to form patterned gate structures above the gate dielectric 316 (114 in FIG. 3) and the mask 228 is removed. In FIG. 5K, the patterned gate structures are encapsulated (116 In FIG. 3) by forming a single or multi-layer encapsulation structure 332 along the sidewalls and top of the gate structures. Drain extension implants 334a and 334b are then performed (118 in FIG. 3) with suitable masking (not shown) to introduce p-type dopants into prospective PMOS source/drain regions 336 and to introduce n-type dopants into prospective NMOS source/drain regions 338, respectively, with the field oxide 310 and patterned gate structures operating as an implantation mask.

In FIG. 5L sidewall spacers 340 are formed (e.g., 120 in FIG. 3) along the lateral sidewalls of the patterned gate structures. Source/drain implantation processes 342a and 342b are then performed (122 in FIG. 3) with suitable masks (not shown) to implant boron or other p-type impurities into the PMOS regions, and arsenic, phosphorus or other n-type impurities into the NMOS regions to further define the PMOS and NMOS source/drains 336 and 338, respectively. In FIG. 5M, a second metal 341 is deposited over the device 302 (124 in FIG. 3) via a deposition process 343 (e.g., sputtering, CVD, ALD, etc.), wherein the deposited second metal material 341 and the thickness thereof may be adjusted to meet any required sheet resistivity requirements for the resulting transistors. In addition, the thicknesses of the second metal 341 and the second silicon-containing material 337 may be selected to provide for substantially complete consumption of the second silicon-containing material 337 (e.g., FIG. 5O below), or a certain amount of the silicon-containing material 337 may remain following the silicidation annealing (e.g., FIG. 5N below).

FIGS. 5N and 5O illustrate a second silicidation anneal process 345 for these two possible approaches. The anneal 345 reacts the second metal 341 with the second silicon-containing material 337 to form a second metal silicide 344a above the first metal silicide 319 of the gate structures, and concurrently forms metal silicide source/drain contacts 344b over the source drains 336 and 338, after which any remaining (e.g., unreacted) second metal material 341 is removed. Any second metal may be used in forming the second silicide 344a of the gate within the scope of the invention, for example, nickel or cobalt, which can be tailored according to sheet resistivity considerations. Alternatively, the same metal type may be used for both the upper and lower silicides 319 and 344a, such as refractory metals (e.g., molybdenum, tungsten, tantalum, titanium, hafnium, etc.). In another possible implementation, separate silicidation processes can be used in forming the upper gate silicide 344a and the source/drain silicide contacts 344b.

The gate processing according to the exemplary method 100 illustrates several aspects of the present invention, including the use of thin first silicon-containing material 312 (FIG. 5A), the provision of capping layers 313 (FIG. 5E), and barrier layers 333 (FIG. 5H) in fabricating the transistor gate structures in the exemplary device 302. These different techniques can be employed in combination as illustrated and described above, or these techniques can be employed separately in fabricating transistor gates within the scope of the invention.

Referring now to FIGS. 3, 6, and 7A–7O, another aspect of the invention provides gate fabrication methods wherein the lower gate silicide is a multilayer stack structure comprising a plurality of thin metal silicide sublayers. The multilayer silicide stack aspects of the invention may be employed separately or in combination with one, some, or all of the above illustrated thin first silicide, capping layer, and/or barrier layer features of the invention, wherein all such separate or combined implementations are contemplated as falling within the scope of the invention and the appended claims. The individual sublayers of the lower silicide stack can be made very thin to facilitate accurate controlled implantation for setting the gate work function, and also to facilitate low temperature fabrication of the first silicide. For example, the silicide sublayers can be a few monolayers up to several tens of angstroms thick, wherein the formation and doping of thin silicide sublayers can be fine tuned according to a desired lower silicide work function.

The sublayers can be individually created by forming a silicon-containing material over the gate dielectric or over a preceding sublayer, forming a metal over the silicon-containing material, and reacting the metal with the silicon-containing material to form a metal silicide sublayer. The individual silicon-containing layers and/or the metal layers can be doped by implantation prior to or after silicidation annealing. In addition, the individual sublayers may be separately annealed to form silicide, or may be annealed in a single operation. Moreover, the individual sublayers can be formed using the same or different silicon-containing materials, and/or the same or different metals, and can be individually protected with capping layers formed over the metal layers prior to sublayer silicidation annealing, and/or with barrier layers formed over the individual sublayers after the individual anneals. Alternatively, a single barrier layer can be formed over the completed multilayer structure to inhibit adverse interaction with subsequently formed second silicon-containing material overlying the multilayer lower silicide.

Figure 7A:
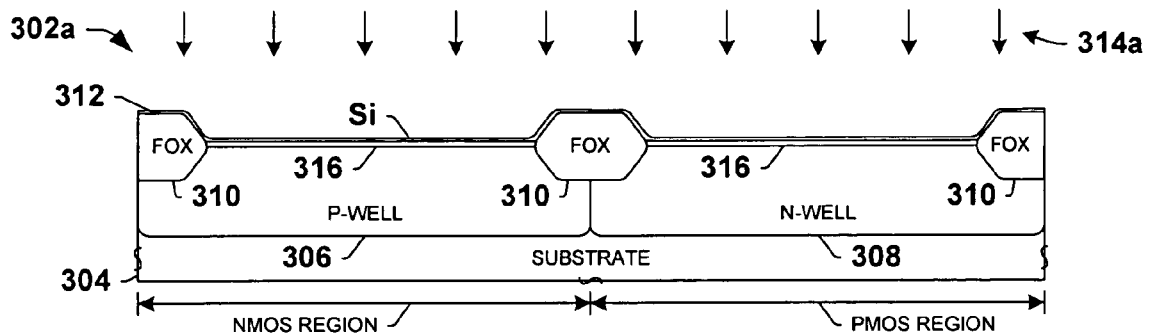
FIGS. 7A–7O are partial side elevation views in section illustrating exemplary NMOS and PMOS transistors undergoing gate and other fabrication processing in accordance with the invention, wherein a lower gate silicide is formed as a multilayer structure in accordance with the invention.
Figure 7B:
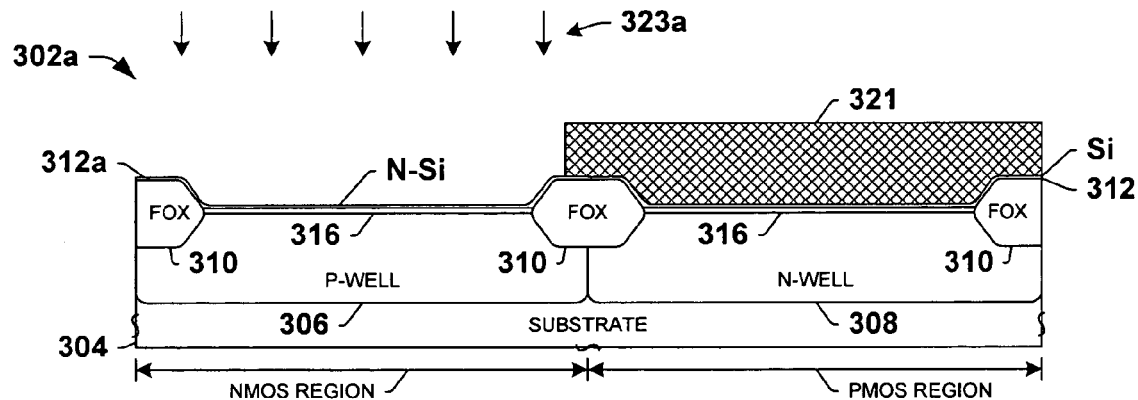
Figure 7C:
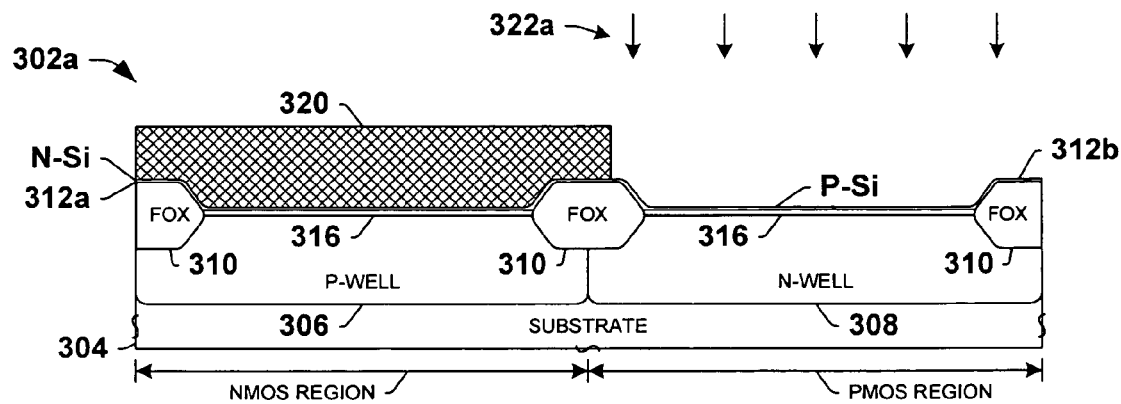
Figure 7D:
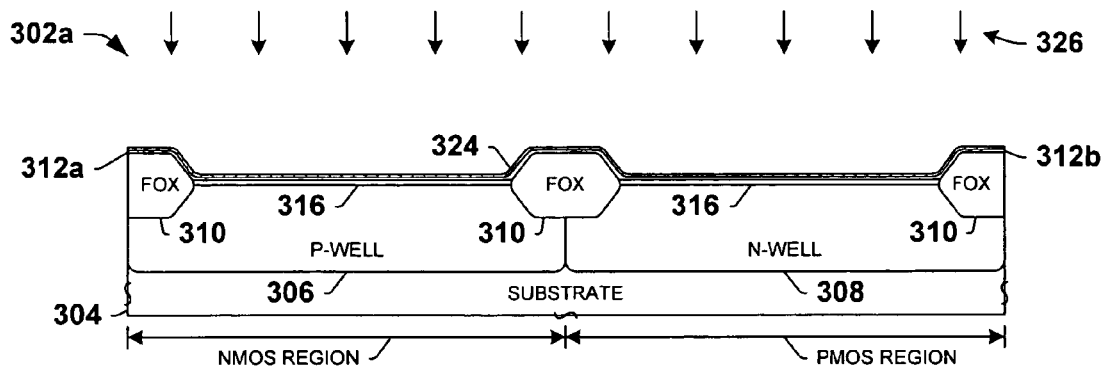
Figure 7E:
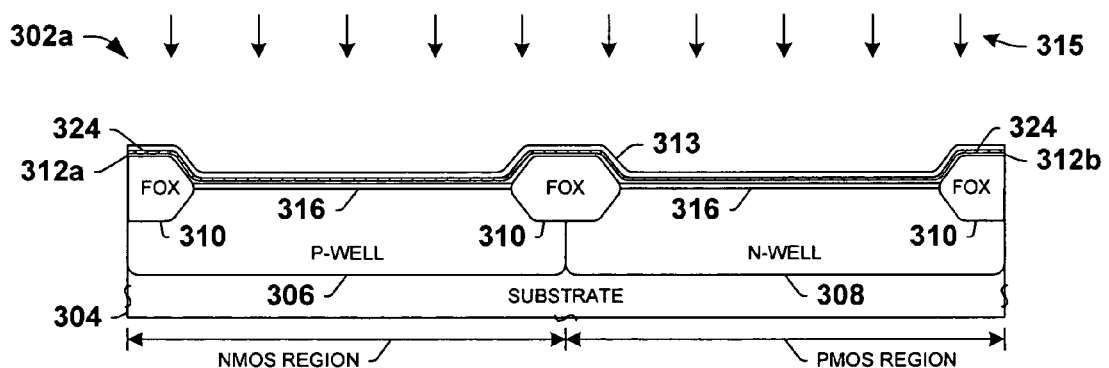
Figure 7F:
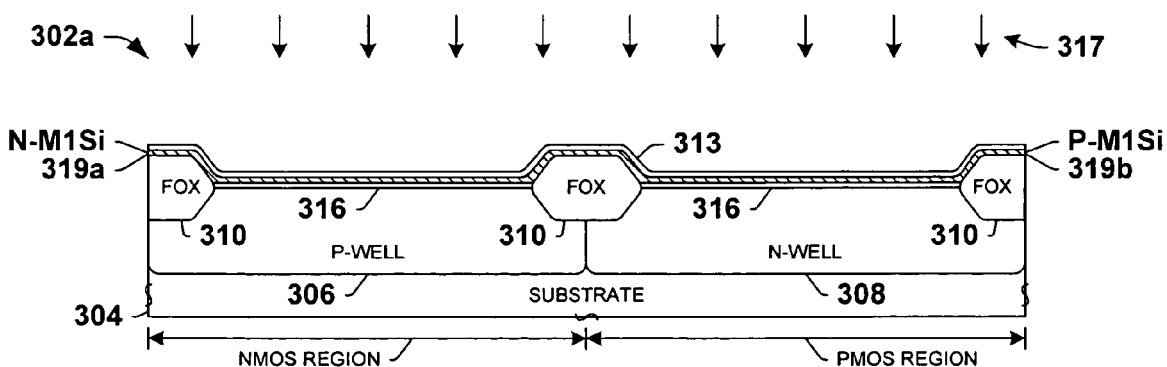
Figure 7G:
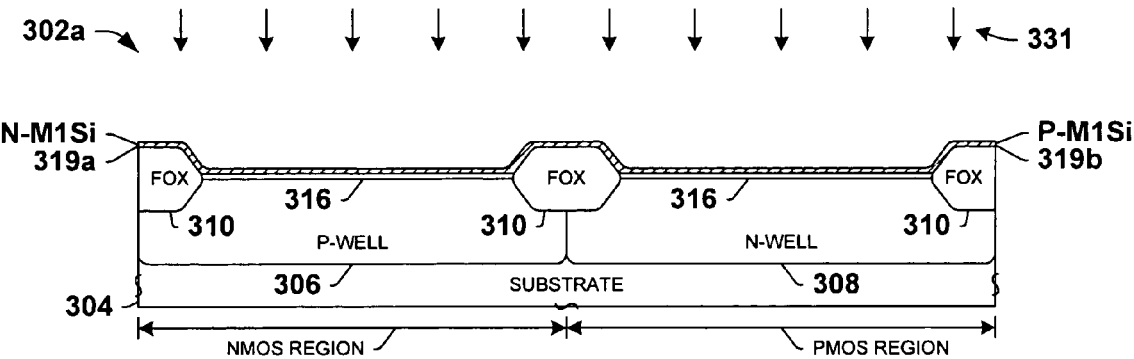
Figure 7H:
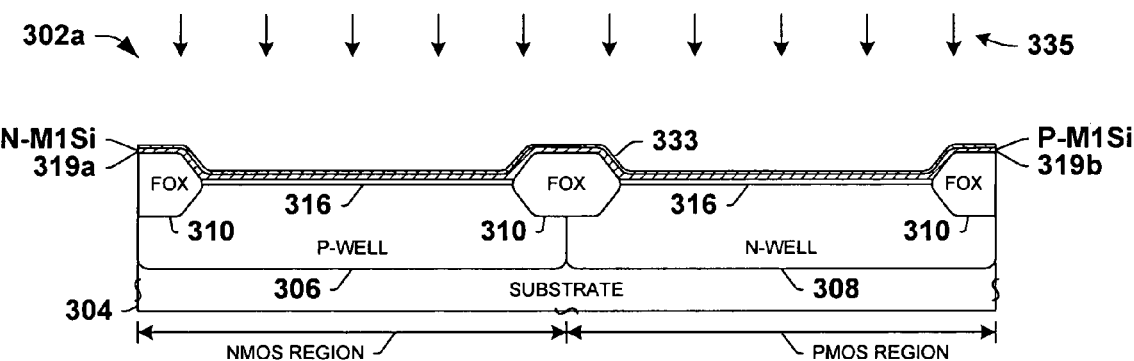
Figure 7I:
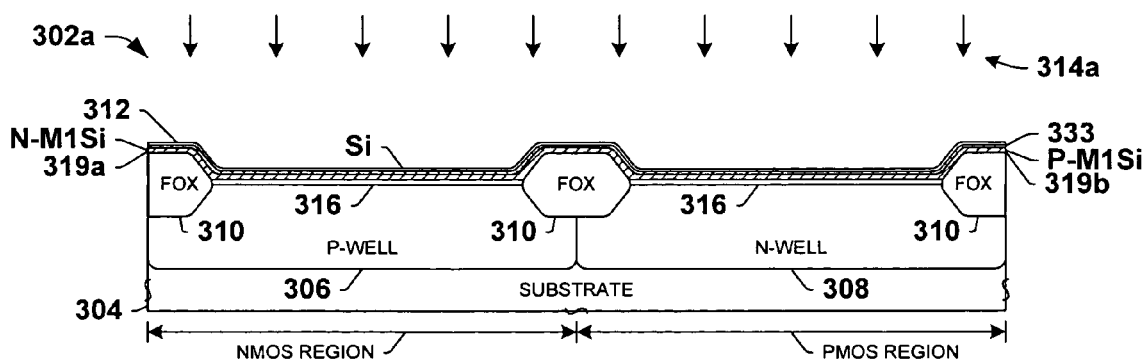
Figure 7J:
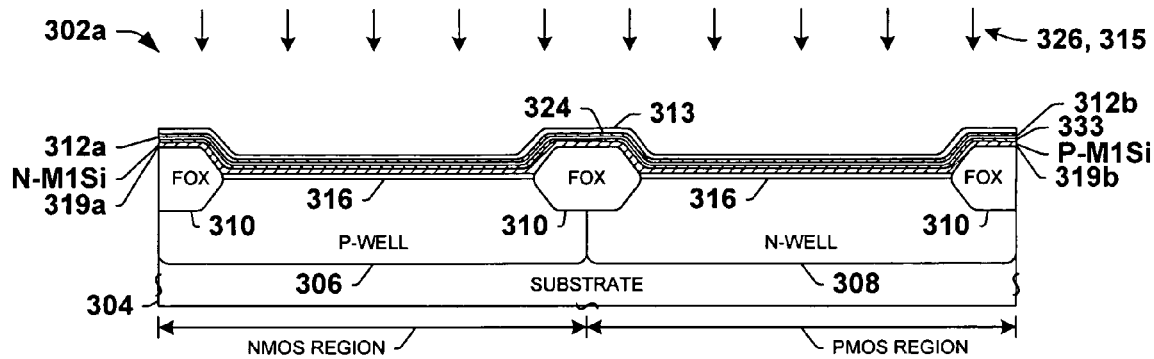
Figure 7K:
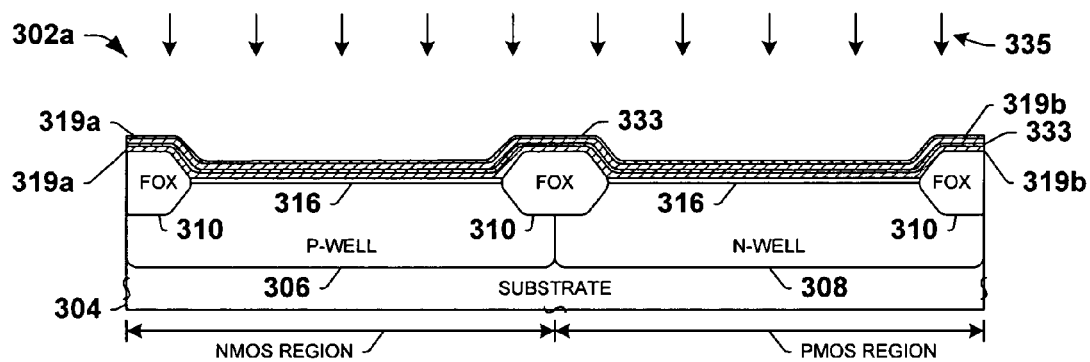
Figure 7L:
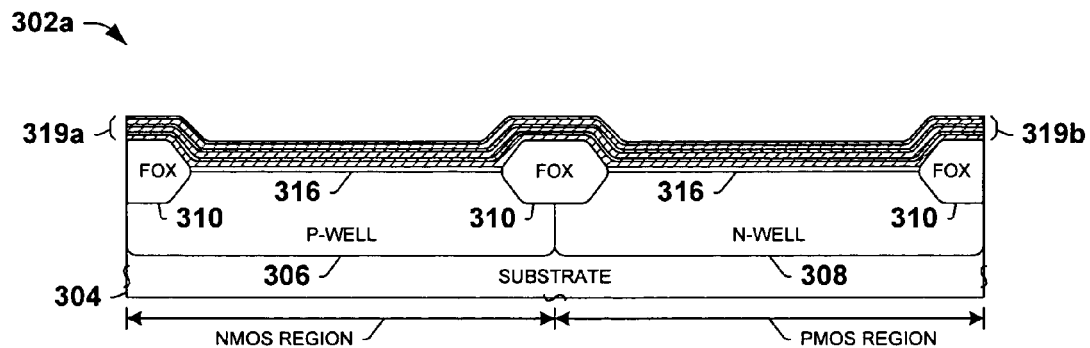
Figure 7M:
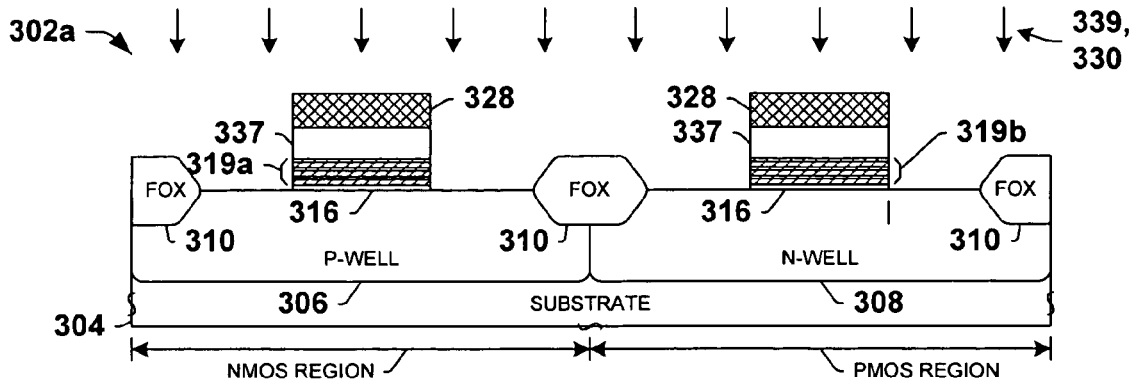
Figure 7N:
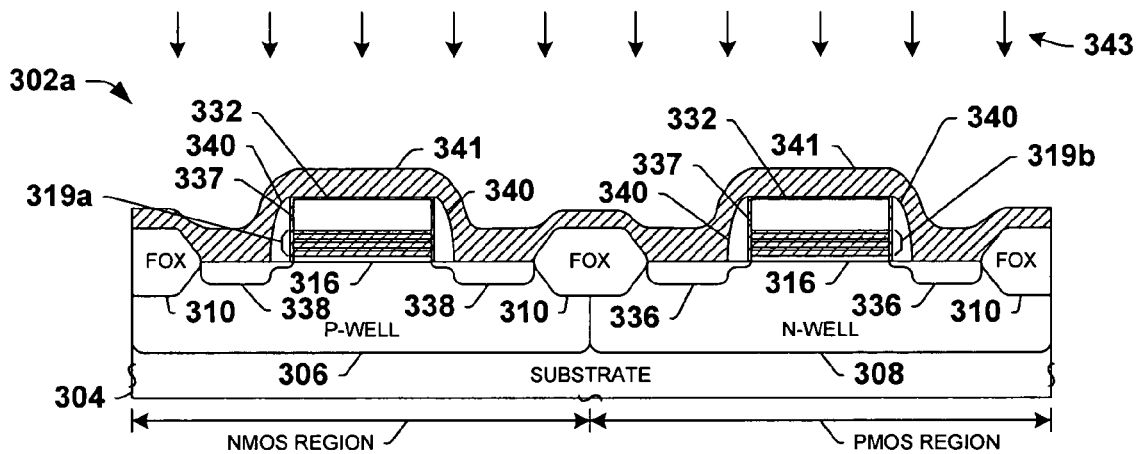
Figure 7O:
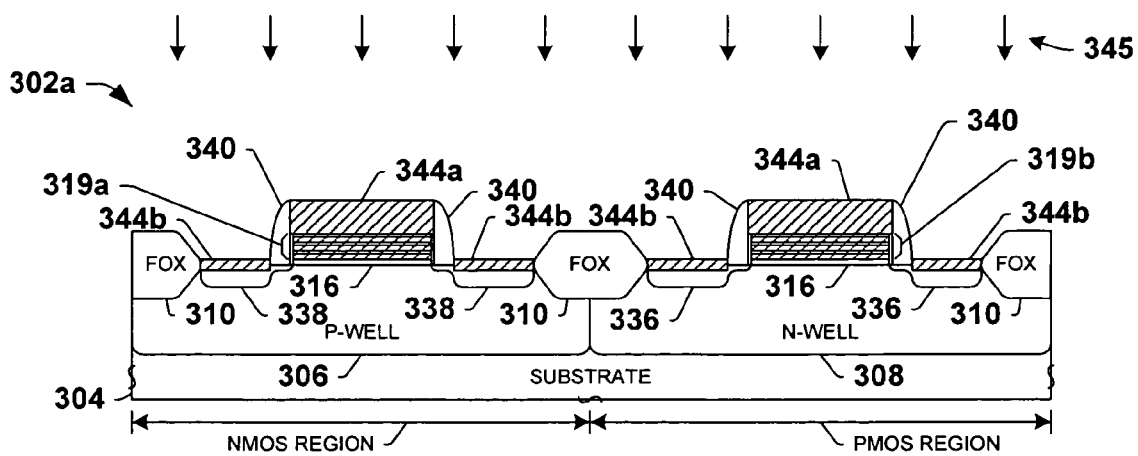

FIG. 6 illustrates an exemplary multilayer implementation of the lower silicide fabrication as part of the exemplary method 100 above (e.g., 110 in FIG. 3), and FIGS. 7A–7O illustrate an exemplary CMOS device 302a at various stages of fabrication processing generally in accordance with the multilayer lower silicide approach. Where possible in the following description and drawings, similar structures, materials, and processes are accordingly referenced with like numbers as described above.

In FIG. 7A, a first silicon-containing material 312 (e.g., polycrystalline or amorphous silicon, silicon germanium, or other silicon-containing material) is formed over the gate dielectric 316 to a thickness of tens of Å or less (e.g., about 10 Å in one example) via a deposition process 314a (e.g., CVD, etc. at 400 in FIG. 6). The material 312 may be formed directly over the gate dielectric 316, or one or more intervening materials may be situated between the gate dielectric 316 and the first silicon-containing material 312 within the scope of the invention. The thin silicon-containing material 312 is then selectively implanted via processes 323a and 322a in FIGS. 7B and 7C (402 in FIG. 6) to form p-doped silicon 312b in PMOS regions and n-doped silicon 312a in the NMOS regions.

In FIG. 7D, a thin first metal 324 is formed over the first silicon-containing material 312 (404 in FIG. 6) via sputter or other deposition process 326. The first metal 324 can be any metal, preferably a refractory metal such as molybdenum, tungsten, tantalum, titanium, hafnium, etc., having a thickness selected such that substantially all of the silicon 312 is consumed in the subsequent silicidation reaction for the first sublayer. An optional capping layer 313 is formed in FIG. 7E to any suitable thickness over the first metal 324 via a deposition process 315 (406 in FIG. 6), wherein the capping layer 313 may comprise a metal, for example, titanium or titanium nitride. The capping layer 313 may advantageously prevent oxidation or other damage to the first metal 324, for example, when the device 302a is removed from a sputtering deposition chamber for implantation or annealing. Thereafter, an optional second implantation (not shown) can be performed (408 in FIG. 6) either before or after the capping layer 313 is formed.

The first metal 324 and the first silicon-containing material 312 can optionally be reacted in FIG. 7F (410 in FIG. 6) via an anneal 317 to form a thin n-doped first metal silicide 319a and a p-doped first metal silicide 319b in the NMOS and PMOS regions, respectively. The first metal 324 and the first silicon 312 are preferably reacted such that substantially all of the silicon-containing material 312 is consumed while leaving little or no remaining (e.g., unreacted) first metal material 324. As discussed below, the entire multi-layer lower metal silicide can be annealed once (e.g., at 418 in FIG. 6) following deposition of all the constituent sublayer silicon-containing material layers and intervening metal layers. In FIG. 7G, any remaining metal 324 and the optional capping layer 313 (if used) are removed (412 in FIG. 6) via a stripping process 331. An optional barrier layer 333 (e.g., metal nitride) can be formed in FIG. 7H via a deposition process 335 (414 in FIG. 6) to prevent the first metal silicide 319 from reacting with subsequently deposited silicon-containing materials.

In the exemplary multilayer approach, further first metal silicide sublayers are then added (e.g., YES at 416 in FIG. 6). In FIG. 7I, another thin silicon-containing material layer 312 is formed over the initial metal silicide sublayer 319 (400 in FIG. 6) via deposition process 314a, which may, but need not, be the same thickness and material used in forming the first sublayer 319. The silicon-containing material 312 can then be implanted separately for the PMOS and NMOS regions (e.g., 402 in FIG. 6, not shown). The implantation of individual silicon-containing layers 312 (e.g., and/or the optional implantation of the overlying metal layers 324) may, but need not, be the same in all sublayers.

In FIG. 7J, another thin first metal 324 is formed over the silicon-containing material 312 (404 in FIG. 6) via the deposition process 326, which may, but need not, be the same material and thickness as that used in forming the initial silicide sublayer 319. An optional capping layer 313 is formed over the metal 324 via the process 315 (406 in FIG. 6), for example, titanium or titanium nitride, and an optional second implantation (not shown) can be performed (408 in FIG. 6). The metal 324 and the silicon-containing material 312 of the second sublayer can then optionally be reacted as shown in FIG. 7K (410 in FIG. 6) via an anneal 317 to form a second thin lower metal silicide 319 sublayer. Any remaining metal 324 (e.g., and any capping layer 313) can then be removed via an optional stripping operation (412 in FIG. 6), and another optional sublayer barrier 333 is formed via a deposition process 335 (414 in FIG. 6). In another possible alternative, no barrier layer is provided at 414 for the individual sublayers, with a single optional barrier layer 333 being formed over the last metal silicide sublayer.

The formation of individual sublayers 319 (e.g., with or without barriers 333) is repeated any number of times (e.g., 416 in FIG. 6) to create a multilayer metal silicide stack indicated as 319a and 319b in FIG. 7L, where the total multilayer stack thickness is preferably about 300 Å or less, more preferably about 200 Å or less. In the illustrated device 302a, each sublayer includes a selectively doped thin first metal silicide 319 and a corresponding barrier layer 333. Other implementations are possible, wherein only certain of the silicide layers 319 are doped, and some may be doped differently than others, and all, some, or none of the sublayers may be provided with corresponding barriers 333. Furthermore, the optional capping layers 313 and stripping processes 331 may be employed in fabricating all, some, or none of the sublayers. Moreover, all, some, or none of the sublayers may be individually annealed. For example, a single final silicidation anneal may be employed (e.g., at 410 for the last sublayer followed by optional strip at 412 and optional final barrier formation at 414, or a single final anneal at 418 in FIG. 4 where no stripping or barrier layer is used) to concurrently react the individual metal and silicon-containing layers. All such variant implementations are contemplated as falling within the scope of the present invention and the appended claims. In such a case, an optional final strip operation can be performed at 420 to remove any remaining metal 324 and any capping layer material 313, and an optional final barrier layer 333 can be formed at 422 over the final lower metal silicide multilayer structure.

In FIG. 7M, a second silicon-containing material 337 is formed above the first metal silicide 319 and any optional barrier layer 333 (212 in FIG. 3), such as polycrystalline or amorphous silicon, silicon germanium, or other silicon-containing material 337, via a deposition process 339. An etch mask 328 is then formed and the exposed portions of the layer 337 and the multilayer silicide stack 319 are etched via a process 330 to form patterned gate structures above the gate dielectric 316 (114 in FIG. 3). In FIG. 7N, the gate structures are encapsulated (116 In FIG. 3) with an encapsulation structure 332, drain extension implants are performed (118 in FIG. 3), sidewall spacers 340 are formed (120 in FIG. 3), and source/drain implantations are performed (122 in FIG. 3) to further define the PMOS and NMOS source/drains 336 and 338, respectively. Thereafter, a second metal 341 is deposited (124 in FIG. 3) via a deposition process 343. In FIG. 7O, a second silicidation anneal process 345 is performed to react the second metal 341 with the second silicon-containing material 337. This concurrently forms a second metal silicide 344a above the first metal silicide 319 of the gate structures and metal silicide source/drain contacts 344b over the source drains 336 and 338, after which any remaining (e.g., unreacted) second metal material 341 is removed.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating transistor gate structures in a semiconductor device, the method comprising:
    forming a gate dielectric above a semiconductor body;
    forming a first silicon-containing material above the gate dielectric to a thickness of about 300 Å or less;
    forming a first metal over the first silicon-containing material;
    reacting the first metal with the first silicon-containing material to form a first metal silicide above the gate dielectric;
    forming a second silicon-containing material above the first metal silicide;
    selectively etching portions of the second silicon-containing material and the first metal silicide to form a patterned gate structure above the gate dielectric;
    forming a second metal over the second silicon-containing material;
    reacting the second metal with the second silicon-containing material to form a second metal silicide above the first metal silicide;
    forming an additional silicon-containing material above the first metal silicide;
    forming an additional metal over the first silicon containing material; and
    reacting the additional layer consisting essentially of metal with the additional silicon-containing material to form an additional metal silicide above the first metal silicide before forming the second silicon-containing material.

2. The method of claim 1, wherein forming the first silicon-containing material comprises forming a first silicon-containing material above the gate dielectric to a thickness of about 200 Å or less.

3. The method of claim 1, wherein forming the first silicon-containing material comprises forming polycrystalline silicon above the gate dielectric.

4. The method of claim 1, wherein forming the first silicon-containing material comprises forming silicon germanium above the gate dielectric.

5. The method of claim 1, wherein forming the first silicon-containing material comprises forming amorphous silicon above the gate dielectric.

6. The method of claim 1, wherein forming the first metal comprises forming a first refractory metal over the first silicon-containing material.

7. The method of claim 1, wherein forming the first metal comprises forming one of molybdenum, tungsten, tantalum, hafnium, and titanium over the first silicon-containing material.

8. The method of claim 1, wherein reacting the second metal with the second silicon-containing material consumes substantially all of the first silicon-containing material.

9. The method of claim 1, wherein forming the second silicon-containing material comprises forming polycrystalline silicon above the first metal silicide.

10. The method of claim 1, wherein forming the second silicon-containing material comprises forming silicon germanium above the first metal silicide.

11. The method of claim 1, wherein forming the second silicon-containing material comprises forming amorphous silicon above the first metal silicide.

12. The method of claim 1, wherein the first and second metal materials are the same.

13. The method of claim 1, wherein forming the second metal comprises forming one of molybdenum, tungsten, tantalum, hafnium, titanium, cobalt, and nickel over the second silicon-containing material.

14. The method of claim 1, further comprising doping the first silicon-containing material before reacting the first metal with the first silicon-containing material.

* * * * *

UNITED STATES PATENT AND TRADEMARK OFFICE
CERTIFICATE OF CORRECTION

PATENT NO. : 7,045,456 B2
APPLICATION NO. : 10/745454
DATED : May 16, 2006
INVENTOR(S) : Robert William Murto, Luigi Colombo and Mark Robert Visokay It is certified that error appears in the above-identified patent and that said Letters Patent is hereby corrected as shown below:

In the ABSTRACT, line 2, replace suicides with silicides.

In Column 6, line 35, replace suicides with silicides.

In Column 7, line 4, replace suicides with silicides.
              line 9, replace suicides with silicides.
              line 28, replace suicides with silicides.

In Column 10, line 8, replace suicides with silicides.
              line 51, replace suicide with silicide.
              line 55, replace suicides with silicides.

In Column 12, line 32, replace suicides with silicides.

Signed and Sealed this

Twenty-fifth Day of July, 2006

JON W. DUDAS
*Director of the United States Patent and Trademark Office*